(12) United States Patent
Kim et al.

(10) Patent No.: US 9,276,003 B2
(45) Date of Patent: Mar. 1, 2016

(54) SEMICONDUCTOR DEVICES AND METHODS OF MANUFACTURING THE SAME

(71) Applicant: SAMSUNG ELECTRONICS CO., LTD., Suwon-si, Gyeonggi-do (KR)

(72) Inventors: Jea-Hyun Kim, Busan (KR); Kyong-Seok Song, Seoul (KR); Sung-Hee Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/208,108

(22) Filed: Mar. 13, 2014

(65) Prior Publication Data
US 2014/0264727 A1    Sep. 18, 2014

(30) Foreign Application Priority Data

Mar. 15, 2013   (KR) .................... 10-2013-0027696

(51) Int. Cl.
*H01L 27/108*    (2006.01)
*H01L 21/762*    (2006.01)
*H01L 27/02*    (2006.01)

(52) U.S. Cl.
CPC .... *H01L 27/10855* (2013.01); *H01L 21/76224* (2013.01); *H01L 27/0207* (2013.01); *H01L 27/10814* (2013.01); *H01L 27/10876* (2013.01); *H01L 27/10885* (2013.01); *H01L 27/10888* (2013.01)

(58) Field of Classification Search
None
See application file for complete search history.

(56) References Cited

U.S. PATENT DOCUMENTS

| 5,494,857 A | * | 2/1996 | Cooperman et al. ......... 438/437 |
| 5,834,161 A | | 11/1998 | Bae |
| 5,838,036 A | * | 11/1998 | Mori ............................ 257/296 |
| 6,054,394 A | * | 4/2000 | Wang ........................... 438/753 |
| 6,291,846 B1 | | 9/2001 | Ema et al. |
| 8,110,507 B2 | | 2/2012 | Park |
| 2001/0038134 A1 | * | 11/2001 | Kumashiro ................. 257/394 |
| 2010/0055865 A1 | | 3/2010 | You et al. |
| 2010/0171159 A1 | | 7/2010 | Kim |
| 2011/0108889 A1 | | 5/2011 | Xing et al. |
| 2011/0156116 A1 | | 6/2011 | Eppich |

FOREIGN PATENT DOCUMENTS

| JP | 11-186517 | 7/1999 |
| KR | 10-0169598 B1 | 10/1998 |
| KR | 10-2000-0003883 A | 1/2000 |

(Continued)

*Primary Examiner* — Bilkis Jahan
*Assistant Examiner* — Kevin Quinto
(74) *Attorney, Agent, or Firm* — Myers Bigel Sibley & Sajovec, PA

(57) ABSTRACT

A semiconductor device includes a substrate with an active pattern, the active pattern having a first extension portion extending in a first direction substantially parallel to a top surface of the substrate, a second extension portion extending from a first end of the first extension portion in a third direction oriented obliquely to the first direction, a third extension portion extending from a second end of the first extension portion in a direction opposed to the third direction, a first projection portion protruding from the second extension portion in a direction opposed to the first direction, the first projection portion being spaced apart from the first extension portion, and a second projection portion protruding from the third extension portion in the first direction, the second projection portion being spaced apart from the first extension portion.

20 Claims, 23 Drawing Sheets

(56) References Cited

FOREIGN PATENT DOCUMENTS

| KR | 10-2006-0038609 A | 5/2006 |
| KR | 10-2006-0124388 A | 12/2006 |
| KR | 10-2008-0063890 A | 7/2008 |
| KR | 10-2010-0028790 A | 3/2010 |
| KR | 10-2011-0090580 A | 8/2011 |

* cited by examiner

THIRD DIRECTION  SECOND DIRECTION

FIRST DIRECTION

THIRD DIRECTION
SECOND DIRECTION
FIRST DIRECTION

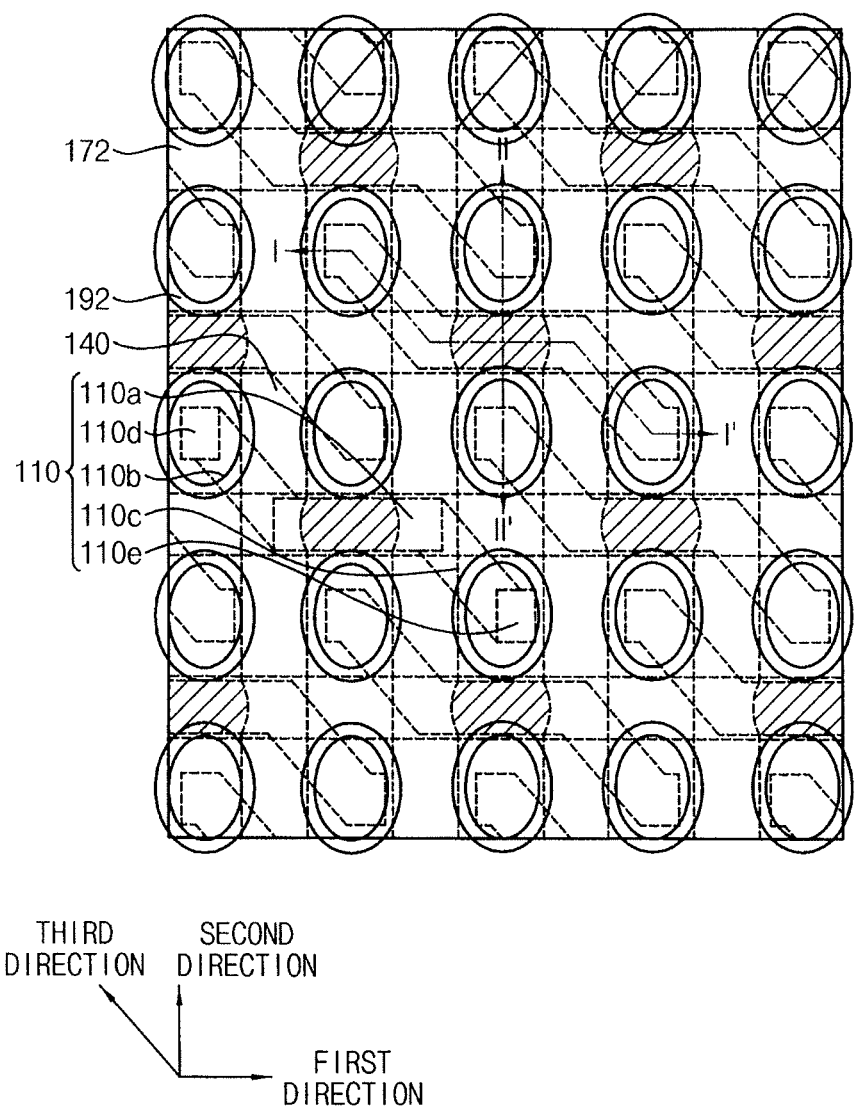

FIG. 10A
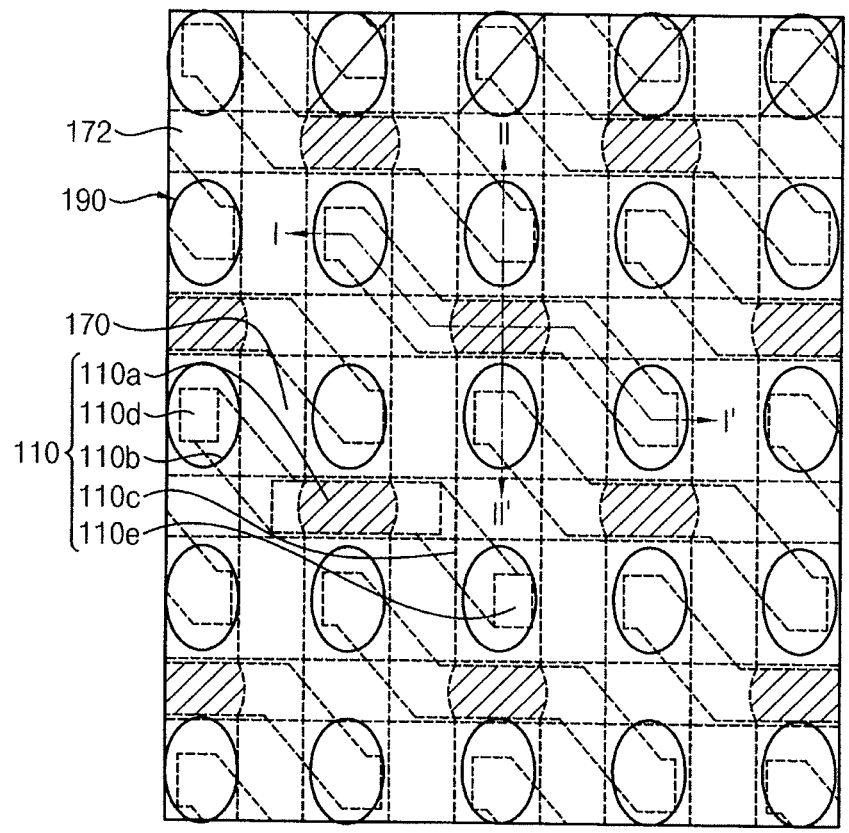
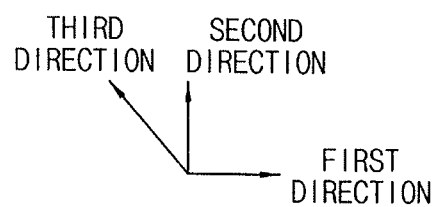

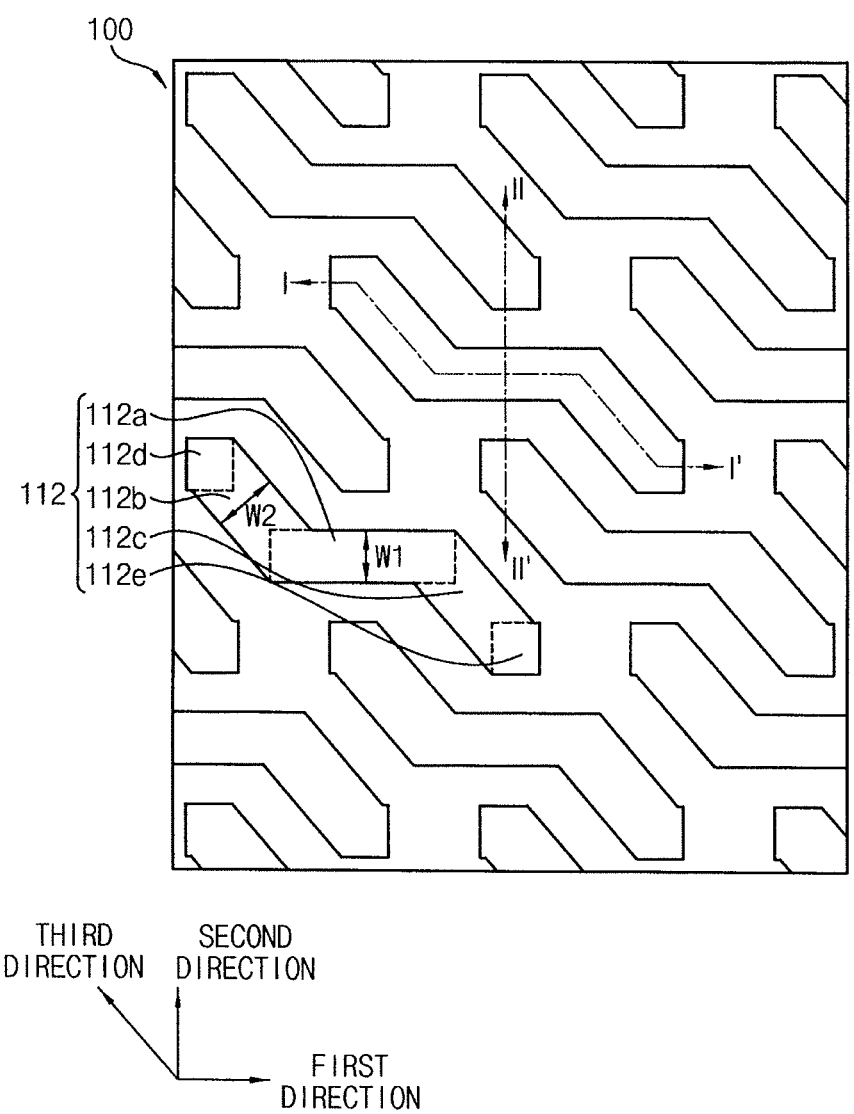

FIG. 15
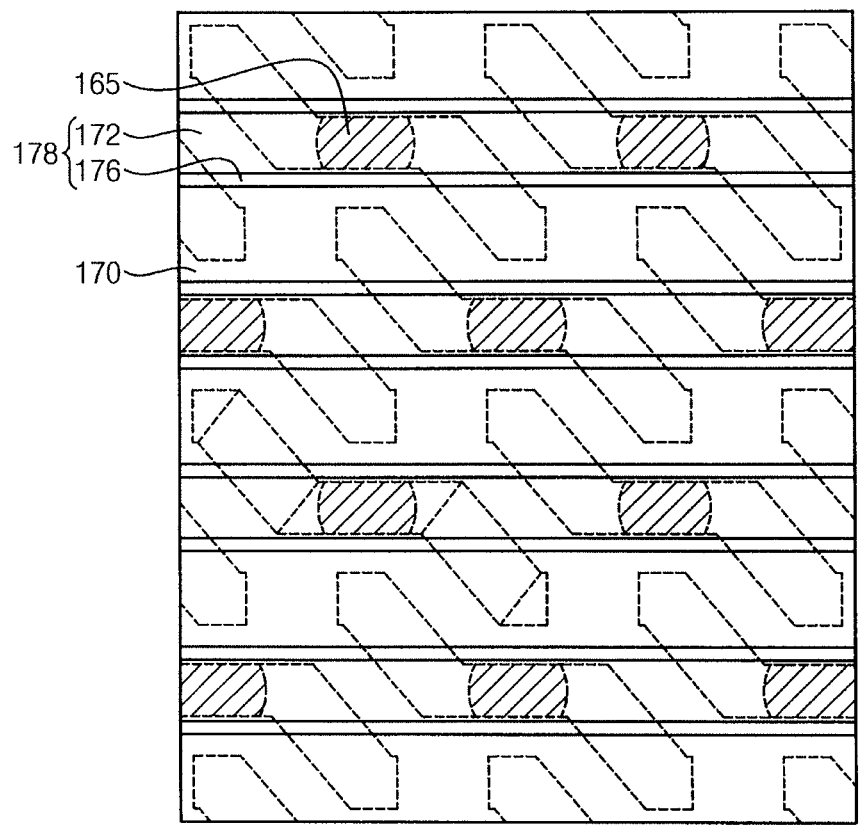
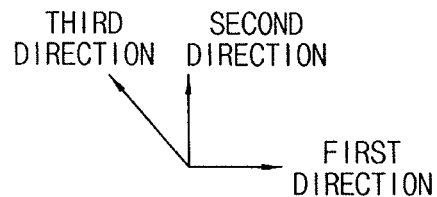

SEMICONDUCTOR DEVICES AND METHODS OF MANUFACTURING THE SAME

CROSS-REFERENCE TO RELATED APPLICATION

Korean Patent Application No. 10-2013-0027696, filed on Mar. 15, 2013, in the Korean Intellectual Property Office, and entitled: "Semiconductor Devices and Methods of Manufacturing The Same," is incorporated by reference herein in its entirety.

BACKGROUND

1. Field

Example embodiments relate to semiconductor devices and methods of manufacturing the semiconductor devices.

2. Description of the Related Art

Recently, as the integration degree of a semiconductor device increases, a size of an active pattern has been decreased. Portions of the active pattern may be electrically connected to a bit line and/or a capacitor through contacts. However, as the size of the active pattern decreases, there are fewer process margins between the active pattern and the contacts.

SUMMARY

Example embodiments provide a semiconductor device including an active pattern with sufficient process margin to ensure reliability.

Example embodiments provide a method of manufacturing a semiconductor device including an active pattern with sufficient process margin to ensure reliability.

According to some example embodiments, there is provided a semiconductor device including a substrate. The substrate includes an active pattern surrounded by an isolation layer disposed at an upper portion of the substrate. The active pattern includes a first extension portion, a second extension portion, a third extension portion, a first projection portion and a second projection portion. The first extension portion extends in a first direction substantially parallel to a top surface of the substrate. The second extension portion extends from a first end of the first extension portion in a third direction oriented obliquely to the first direction. The third extension portion extends from a second end of the first extension portion in a direction opposed to the third direction. The first projection portion protrudes from the second extension portion in a direction opposed to the first direction. The first projection portion is spaced apart from the first extension portion. The second projection portion protrudes from the third extension portion in the first direction. The second projection portion is spaced apart from the first extension portion.

In example embodiments, the first projection portion and the second projection portion may be 180 degree rotationally symmetric about an axis passing through a center of the first extension portion in a fourth direction perpendicular to the first direction and the third direction, and the second extension portion and the third extension portion may be 180 degree rotationally symmetric about the axis.

In example embodiments, lengths of the first projection portion and the second projection portion in the first direction may be substantially smaller than a length of the first extension portion in the first direction.

In example embodiments, a width of the first extension portion may be substantially the same as widths of the second extension portion and the third extension portion.

In example embodiments, a width of the first extension portion may be substantially smaller than widths of the second extension portion and the third extension portion.

In example embodiments, the semiconductor device may further comprise a bit line, a first contact, a capacitor and a second contact. The bit line extends in the first direction above the substrate. The first contact may connect the bit line with the first extension portion of the active pattern. The capacitor is disposed above the substrate. The second contact may connect the capacitor with the first projection portion or the second projection portion of the active pattern.

In example embodiments, a cross section of a region, where the first contact and the active pattern are overlapped, may have a rectangular shape or an elliptical shape extending in the first direction.

In example embodiments, a cross section of the second contact may have a rectangular shape extending in the first direction.

In example embodiments, a plurality of active patterns may be arranged in the first direction and the third direction.

According to some example embodiments, there is provided a method of manufacturing a semiconductor device. In the method, a trench is formed by removing an upper portion of a substrate, thereby defining an active pattern of the substrate. An isolation layer is formed to fill the trench. The active pattern includes a first extension portion, a second extension portion, a third extension portion, a first projection portion and a second projection portion. The first extension portion extends in a first direction substantially parallel to a top surface of the substrate. The second extension portion extends from a first end of the first extension portion in a third direction oriented obliquely to the first direction. The third extension portion extends from a second end of the first extension portion in a direction opposed to the third direction. The first projection portion protrudes from the second extension portion in a direction opposed to the first direction. The first projection portion is spaced apart from the first extension portion. The second projection portion protrudes from the third extension portion in the first direction. The second projection portion is spaced apart from the first extension portion.

In example embodiments, forming the trench may comprise forming a first trench extending in the first direction and the third direction alternately and repeatedly, thereby defining a preliminary active pattern and forming a second trench extending in a second direction perpendicular to the first direction. The second trench may be in fluid communication with the first trench.

In example embodiments, a first contact may be formed to directly contact the first extension portion of the active pattern. A bit line extending in the first direction may be formed to be electrically connected to the first contact. A second contact may be formed to directly contact the first projection portion or the second projection portion of the active pattern. A capacitor may be formed to be electrically connected to the second contact.

In example embodiments, a bit line spacer is formed on a side wall of the bit line after forming the bit line.

In example embodiments, forming the second contact may comprise forming an insulating interlayer above the substrate to cover the bit line, forming a contact hole exposing the first projection portion or the second projection portion of the active pattern by removing the insulating interlayer and forming a conductive pattern to fill the contact hole.

In example embodiments, the contact hole may be disposed not to overlap the bit line or the bit line spacer, and the contact hole may have a rectangular shape extending in the first direction.

According to some example embodiments, there is provided a semiconductor device. The semiconductor device including a substrate including an active pattern surrounded by an isolation layer, the isolation layer being disposed at an upper portion of the substrate, wherein the active pattern includes a first extension portion extending in a first direction, a first projection portion parallel to and spaced apart from the first extension portion, a second projection portion parallel to and spaced apart from the first extension portion, a second extension portion connecting the first extension portion and the first projection portion, the second extension portion extending in a direction oriented obliquely to the first direction, and a third extension portion connecting the first extension portion and the second projection portion, the second and third extension portions extending in opposite directions relatively to the first extension portion and being parallel to each other.

In example embodiments, the semiconductor device may further include a bit line extending in the first direction above the substrate, a first contact connecting the bit line with the first extension portion of the active pattern, a capacitor above the substrate, and a second contact connecting the capacitor with the first projection portion or the second projection portion of the active pattern.

In example embodiments, longitudinal directions of the first contact and the first extension portion may be parallel.

In example embodiments, an overlap region between the first contact and the first extension portion may be rectangular or elliptical, a major axis of the rectangular area or the elliptical areas extending in the first direction.

In example embodiments, longitudinal directions of the first contact, second contact, and the first extension portion may be parallel.

BRIEF DESCRIPTION OF THE DRAWINGS

Example embodiments will be more clearly understood from the following detailed description taken in conjunction with the accompanying drawings. FIGS. 1 to 18 represent non-limiting, example embodiments as described herein.

FIG. 1 illustrates a plan view of a semiconductor device including an active pattern in accordance with some example embodiments;

FIGS. 2 to 10B illustrate plan views and cross-sectional views of stages in a method of manufacturing a semiconductor device in accordance with some example embodiments;

FIG. 11 illustrates a plan view of a semiconductor device including an active pattern in accordance with other example embodiments;

FIGS. 12 to 17 illustrate plan views of stages in a method of manufacturing a semiconductor device in accordance with other example embodiments;

FIG. 18 illustrates a block diagram of a system including a semiconductor device in accordance with example embodiments.

DETAILED DESCRIPTION

Figure 1:
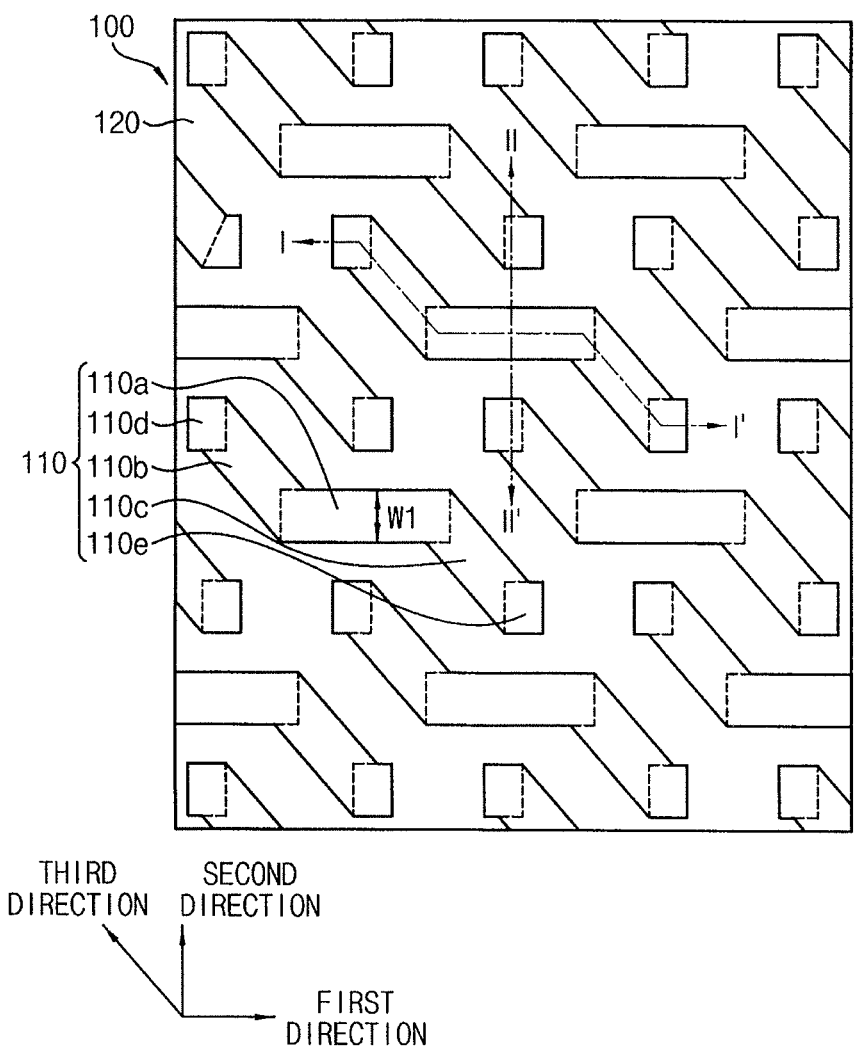

Various example embodiments will be described more fully hereinafter with reference to the accompanying drawings, in which some example embodiments are shown. Example embodiments may, however, be embodied in many different forms and should not be construed as limited to those set forth herein. Rather, these example embodiments are provided so that this description will be thorough and complete, and will fully convey the scope of exemplary implementations to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will also be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 illustrates a plan view of a semiconductor device including an active pattern in accordance with some example embodiments. Referring to FIG. 1, the semiconductor device may include a substrate 100 including an active pattern 110 and an isolation layer 120 surrounding the active pattern 110.

The substrate 100 may include a semiconductor substrate, e.g., a silicon substrate, a germanium substrate, a silicon-germanium substrate, a silicon-on-insulator (SOI) substrate, or a germanium-on-insulator (GOI) substrate.

The isolation layer 120 may include an insulation material, e.g., silicon oxide. The isolation layer 120 may be disposed on the substrate 100. In this case, an upper portion of the substrate 100 surrounded by the isolation layer 120 may be defined as the active pattern 110. That is, the active pattern 110 may be integrally formed with the substrate 100, and a sidewall of the active pattern 110 may be surrounded by the isolation layer 120.

In example embodiments, a plurality of active patterns 110 may be arranged in a first direction substantially parallel to a top surface of the substrate 100 and a third direction oriented obliquely with respect to the first direction. Each of the active patterns 110 may include a plurality of extension portions extending in different directions. In example embodiments, the active pattern 110 may include a first extension portion 110a, a second extension portion 110b, a third extension portion 110c, a first projection portion 110d, and a second projection portion 110e that are integral with each other and define a single active pattern 110.

The first extension portion 110a may extend in the first direction. The first extension portion 110a may have a first width W1 in a second direction substantially perpendicular to the first direction. The first extension portion 110a may include a first end and a second end which may be spaced apart from each other in the first direction.

The second extension portion 110b may extend from the first end of the first extension portion 110a in the third direction, and the third extension portion 110c may extend from the second end of the first extension portion 110a in a direction opposed to the third direction. In this case, the second extension portion 110b and the third extension portion 110c may have substantially the same length and the same width. Accordingly, the second extension portion 110b and the third extension portion 110c may be 180 degree rotationally symmetric about an axis passing through a center of the first extension portion 110a. In example embodiments, each of the second extension portion 110b and the third extension portion 110c may have a width substantially the same as the first width W1 of the first extension portion 110a.

Further, the first projection portion 110d may protrude from the second extension portion 110b in a direction opposed to the first direction, and the second projection portion 110e may protrude from the third extension portion 110c in the first direction. In this case, the first projection portion 110d and the second projection portion 110e may be spaced apart from the first extension portion 110a. That is, the second extension portion 110b may be disposed between the first extension portion 110a and the first projection portion 110d, and the third extension portion 110c may be disposed between the first extension portion 110a and the second projection portion 110e.

In this case, the first projection portion 110d and the second projection portion 110e may have substantially the same length and the same width. Accordingly, the first projection portion 110d and the second projection portion 110e may be 180 degree rotationally symmetric about the axis passing through the center of the first extension portion 110a. In example embodiments, each of the first projection portion 110d and the second projection portion 110e may have a length substantially smaller than that of the first extension portion 110a in the first direction.

In example embodiments, the first projection portion 110d and the second projection portion 110e may have a rectangular planar shape, however embodiments are not be limited thereto. For example, the first projection portion 110d and the second projection portion 110e may have a circular shape or an elliptical planar shape.

According to example embodiments, the active pattern 110 may include the first extension portion 110a, the first projection portion 110d, and the second projection portion 110e that may extend or protrude in the first direction. The first extension portion 110a, the first projection portion 110d, and the second projection portion 110e may directly touch contacts that are electrically connected to a capacitor (see FIG. 10B) or a bit line (see FIG. 10B). The contacts may have a rectangular shape or an elliptical shape extending in the first direction, so that an overlapped area between the contacts and the active pattern 110 may increase. Therefore, a contact resistance between the contacts and the active pattern 110 may decrease, and the active pattern 110 may provide sufficient process margin to ensure reliability.

FIGS. 2 to 10B illustrate plan views and cross-sectional views of stages in a method of manufacturing a semiconductor device in accordance with some example embodiments. FIGS. 2, 3A, 4A, 5A, 6A, 7A, 8A, 9A and 10A illustrate plan views of stages in the method of manufacturing the semiconductor device in accordance with some example embodiments. FIGS. 3B, 4B, 5B, 6B, 7B, 8B, 9B and 10B illustrate cross-sectional views (III) along lines I-I' of FIGS. 3A, 4A, 5A, 6A, 7A, 8A, 9A and 10A and cross-sectional views (IV) along lines II-II' of FIGS. 3A, 4A, 5A, 6A, 7A, 8A, 9A and 10A.

Figure 2:
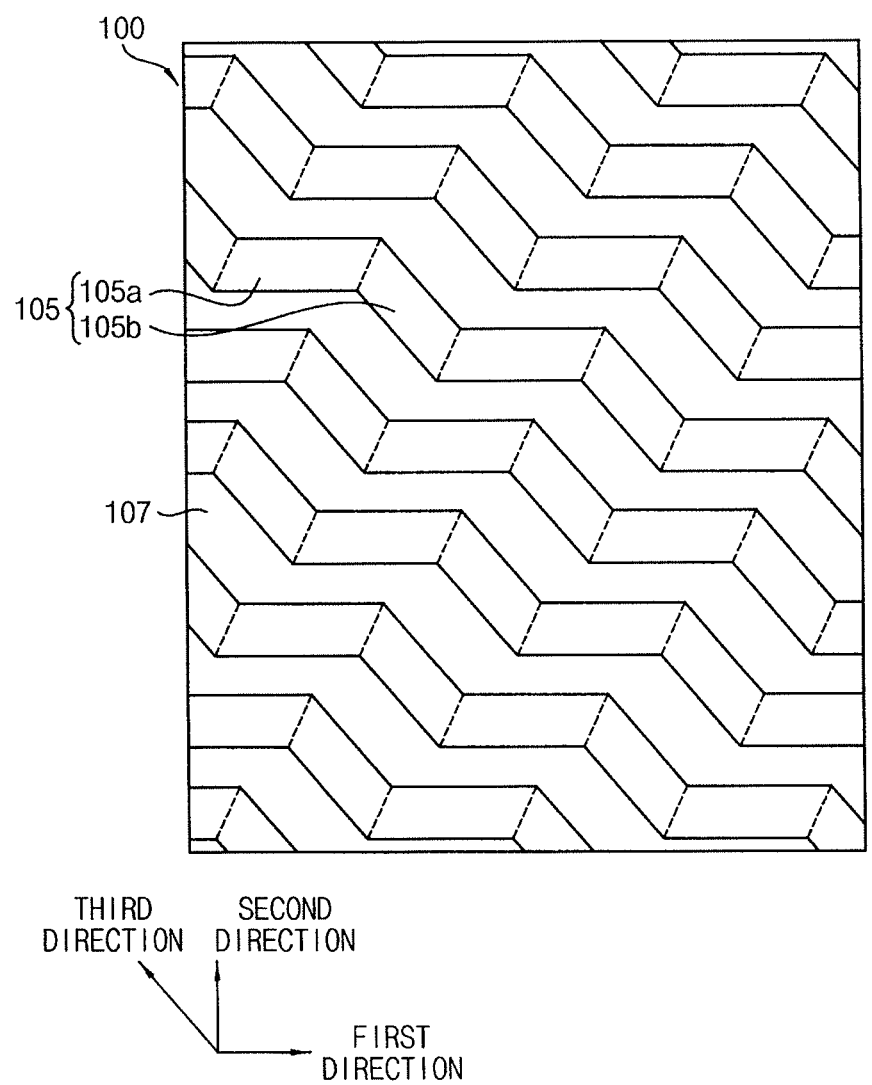

Referring to FIG. 2, an upper portion of the substrate 100 may be removed to form a first trench 107, thereby defining a preliminary active pattern 105. The first trench 107 may be formed by forming a mask on the substrate 100, and removing the upper portion of the substrate 100 using the mask as an etching mask. In example embodiments, a plurality of first trenches 107 may be arranged in a second direction substantially parallel to a top surface of the substrate 100, and upper portions of the substrate between the first trenches 107 may be defined as the preliminary active pattern 105.

In example embodiment, the first trench 107 may extend in a first direction substantially perpendicular to the second direction, and may extend in a third direction oriented obliquely to the first direction. Each of the first trenches 107 may include a plurality of first portions extending in the first direction and a plurality of second portions extending in the third direction. That is, the plurality of first portions of the first trench 107 and the plurality of second portion of the first trench 107 may be arranged alternately and repeatedly, and the first portions and the second portions may be in fluid communication with each other.

Therefore, the preliminary pattern 105 may include first extension portion 105*a* extending in the first direction and second extension portion 105*b* extending in the third direction. Further, the first extension portion 105*a* and the second extension portion 105*b* may be arranged alternately and repeatedly. In example embodiment, the first extension portion 105*a* may have the first width W1 in the second direction, and the second extension portion 105*b* may have a width substantially the same as that of the first extension portion 105*a*.

Figure 3A:
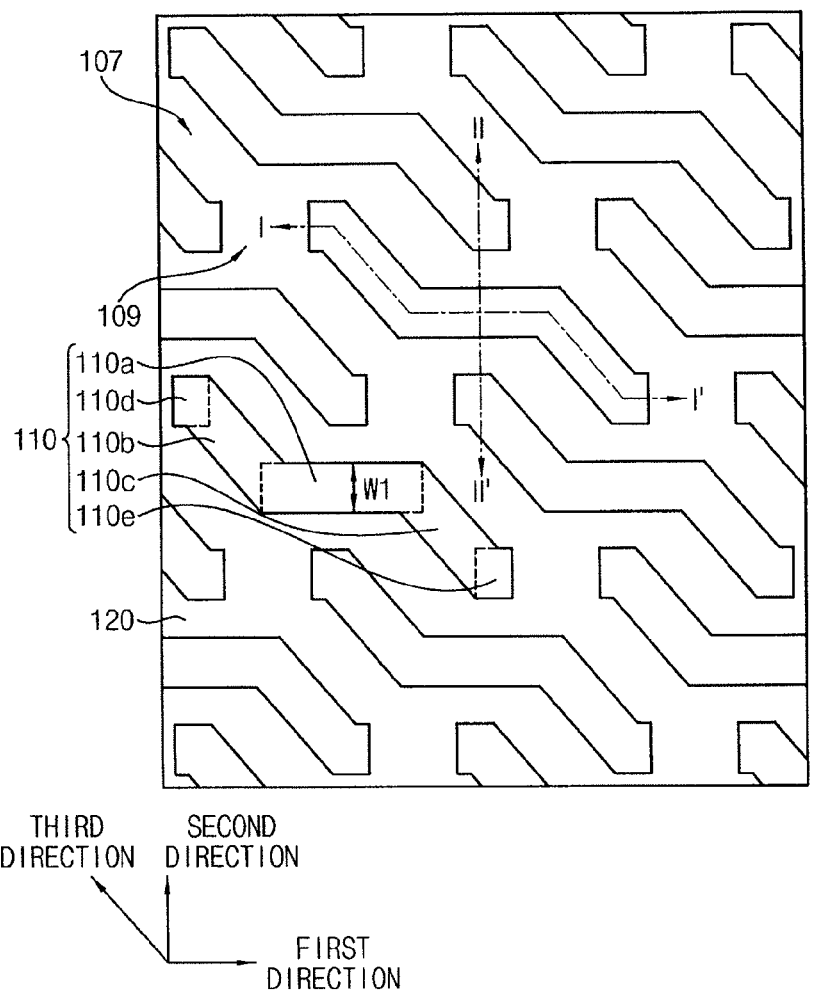
Figure 3B:
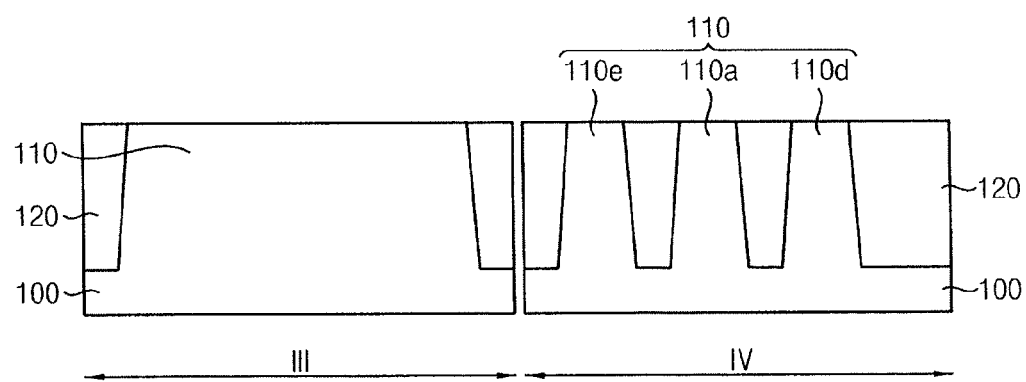

Referring to FIG. 3A and FIG. 3B, an upper portion of the substrate 100 may be removed to from a second trench 109, thereby defining an active pattern 110. Then, an isolation layer 120 may be formed to fill the first trench 107 and the second trench 109.

The second trench 109 may be formed by forming a mask on the substrate 100, and removing the upper portion of the substrate 100 using the mask as an etching mask. In example embodiments, the second trench 109 may be disposed to partially overlap the first extension portion 105*a* of the preliminary active pattern 105. Therefore, some first extension portions 105*a* of the preliminary active pattern 105 may be overlapped with the second trench 109, and other first extension portions 105*a* of the preliminary active pattern 105 may not be overlapped with the second trench 109. The first trench 107 may be in fluid communication with the second trench 109.

Therefore, the active pattern 110 may be defined by the first trench 107 and the second trench 109. The active pattern 110 may include a plurality of extension portions extending in different directions. In example embodiments, the active pattern 110 may include the first extension portion 110*a*, the second extension portion 110*b*, the third extension portion 110*c*, the first projection portion 110*d*, and the second projection portion 110*e*.

The first extension portion 110*a* may extend in the first direction. The second extension portion 110*b* may extend from a first end of the first extension portion 110*a* in the third direction, and third extension portion 110*c* may extend from a second end of the first extension portion 110*a* in a direction opposed to the third direction. The first projection portion 110*d* may protrude from the second extension portion 110*b* in a direction opposed to the first direction, and the second projection portion 110*e* may protrude from the third extension portion 110*c* in the first direction. In this case, the first projection portion 110*d* and the second projection portion 110*e* may be spaced apart from the first extension portion 110*a*.

Accordingly, the second extension portion 110*b* and the third extension portion 110*c* may be 180 degree rotationally symmetric about an axis passing through a center of the first extension portion 110*a*, and the first projection portion 110*d* and the second projection portion 110*e* may be 180 degree rotationally symmetric about the axis.

In example embodiments, the first projection portion 110*d* and the second projection portion 110*e* may have a rectangular planar shape, however embodiments are not be limited thereto. For example, the first projection portion 110*d* and the second projection portion 110*e* may have a circular shape or an elliptical planar shape.

According to example embodiments, the first trench 107 and the second trench 109 may be formed by a multi-patterning process, instead of a single patterning process, due to the limited resolution of the optical patterning, i.e., via a photolithographic process. Therefore, a manufacturing process margin may be guaranteed, e.g., as compared to formation of the first trench 107 and the second trench 109 by a single patterning process.

Then, an insulation layer may be formed on the substrate 100 to fill the first trench 107 and the second trench 109. Next, an upper portion of the insulation layer may be planarized until a top surface of the substrate 100 is exposed, thereby forming the isolation layer 120. In example embodiments, the insulation layer may include, e.g., silicon oxide, silicon nitride, or silicon oxy-nitride.

Figure 4A:
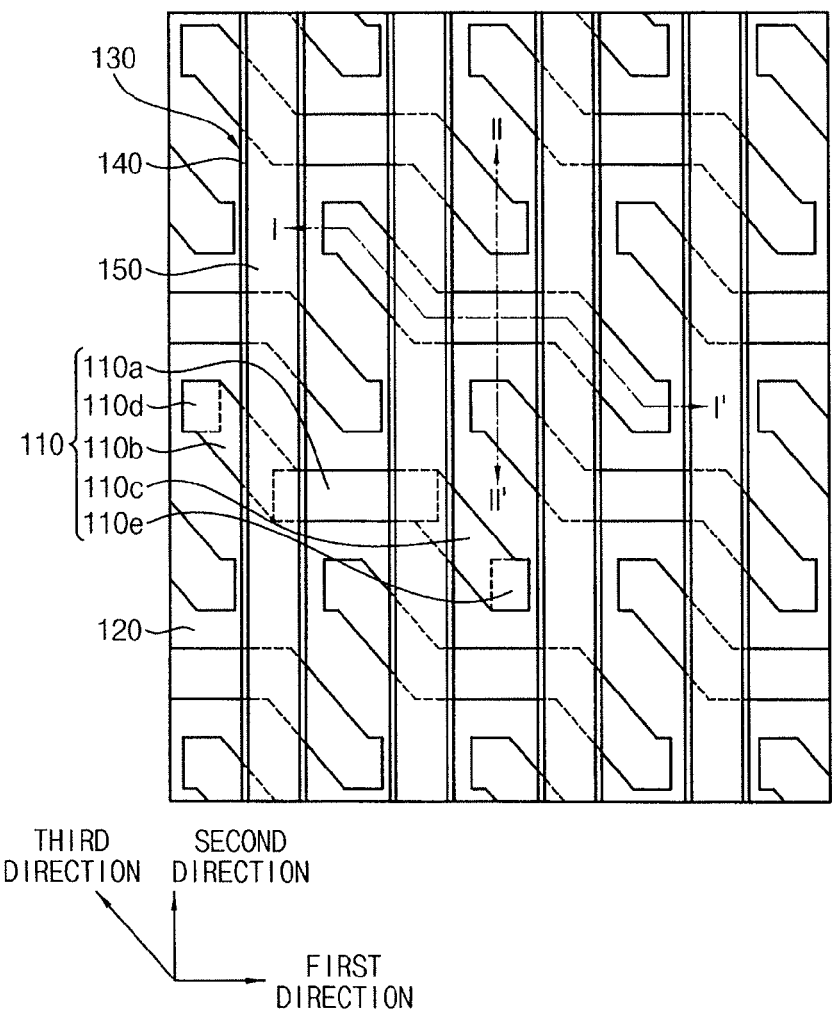
Figure 4B:
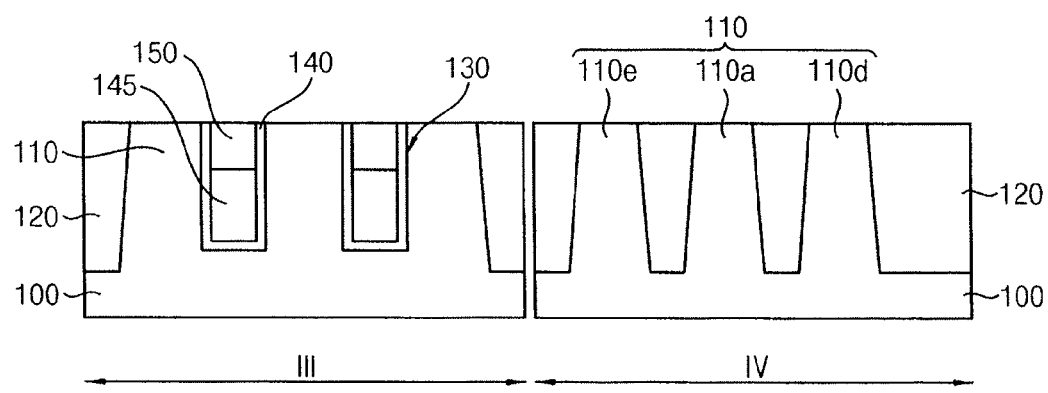

Referring to FIG. 4A and FIG. 4B, upper portions of the substrate 100 and the isolation layer 120 may be removed to form a third trench 130. Then, a gate insulation layer pattern 140, a gate electrode 145, and a gate mask 150 may be formed to fill the third trench 130.

The third trench 130 may extend in the second direction. In example embodiments, a plurality of third trenches 130 may be arranged to be spaced apart from each other along the first direction. For example, a couple of third trenches 130 may be disposed to overlap a single active pattern 110. For example, one third trench 130 may overlap an interface between the first extension portion 110*a* and the second extension portion 110*b*, e.g., a width of the third trench 130 along the first direction may overlap portions of and the interface between the first extension portion 110*a* and the second extension portion 110*b*, and another third trench 130 may overlap an interface between the first extension portion 110*a* and the third extension portion 110*c*, e.g., a width of the third trench 130 along the first direction may overlap portions of and the interface between the first extension portion 110*a* and the third extension portion 110*c*.

The gate insulation layer pattern 140 and the gate electrode 145 may be formed by forming a gate insulation layer and a gate electrode layer on the substrate 100 and the isolation layer 120 to fill the third trench 130, and by planarizing upper portions of the gate insulation layer and the gate electrode layer by an etch back process or a CMP process. The gate electrode 145 may extend in the second direction, and may serve as a word line of the semiconductor device.

In example embodiment, the gate insulation layer may be formed by thermally oxidizing a surface of the substrate 100 exposed by the third trench 130, or by performing a chemical vapor deposition (CVD) process or an atomic layer deposition (ALD) process using silicon oxide or a metal oxide. Further, the gate electrode layer may be formed using a metal or a metal nitride, e.g., tungsten (W), tantalum nitride (TaN), titanium nitride (TiN), and/or tungsten nitride (WN), by a physical vapor deposition process, an ALD process, or a sputtering process.

Then, the gate mask 150 may be formed on the gate electrode 145 to fill an upper portion of the third trench 130. For example, the gate mask layer may be formed using silicon nitride or silicon oxy-nitride.

Therefore, a gate structure may be formed to include the gate insulation layer pattern 140, the gate electrode 145, and the gate mask 150. The gate structure may include the gate electrode 145 buried at the upper portion of the substrate 100, so that the gate structure may constitute a buried channel array transistor (BCAT).

Figure 5A:
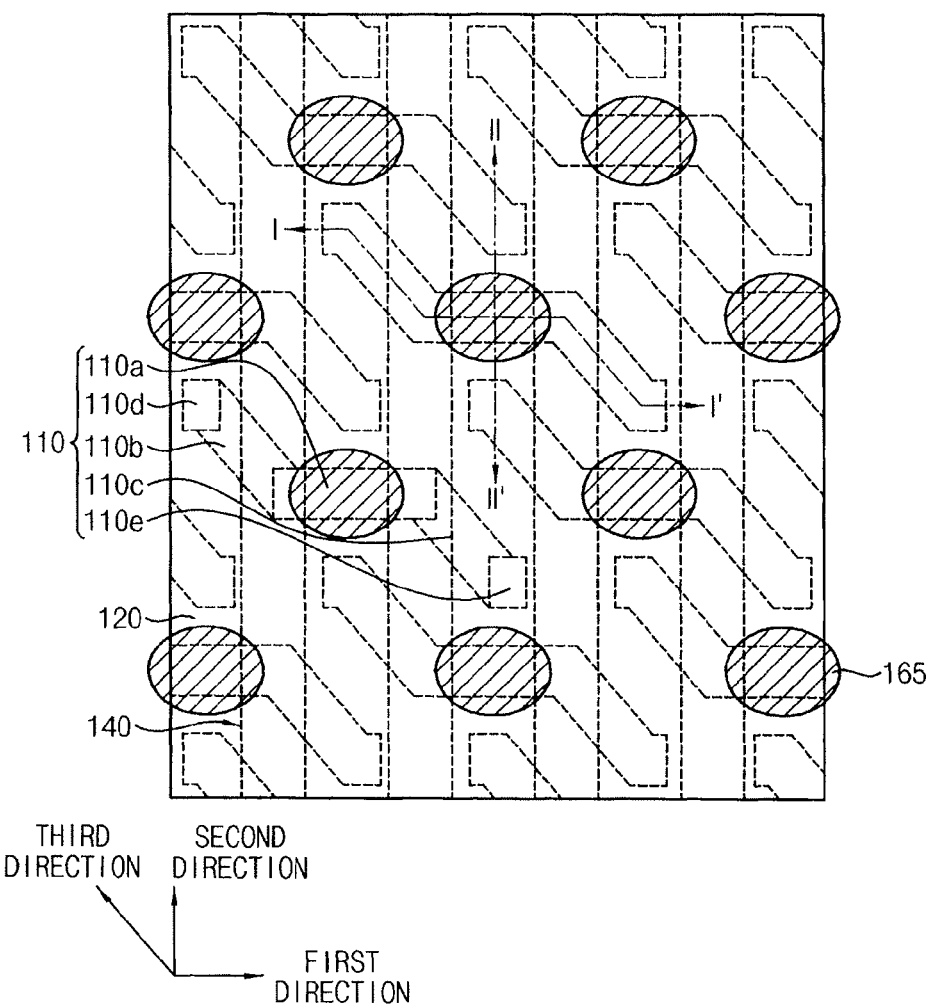
Figure 5B:
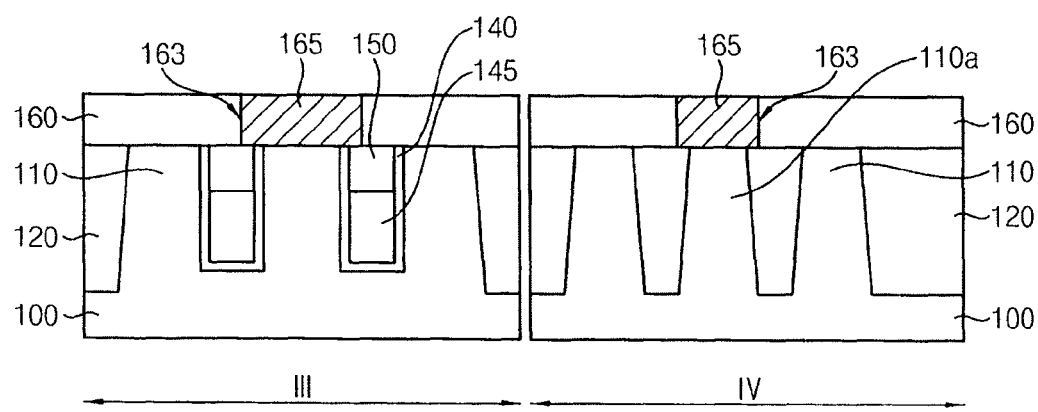

Referring to FIG. 5A and FIG. 5B, a first insulating interlayer 160 may be formed on the substrate 100, the isolation layer 120, the gate mask 150, and the gate insulation layer pattern 140. A first contact 165 may be formed through the first insulating interlayer 160.

In example embodiments, the first insulating interlayer 160 may be formed using silicon oxide, e.g., boro-phospho-silicate glass (BPSG), tonen silazene (TOSZ), undoped silicate glass (USG), spin on glass (SOG), flowable oxide (FOX), and/or tetra-ethyl-ortho-silicate (TEOS). Then, the first insulating interlayer 160 may be partially removed to form a first contact hole 163 exposing the first extension portion 110*a* of the active pattern 110. The first contact hole 163 may exposed the first extension portion 110*a* of the active pattern 110, the gate insulation layer pattern 140, and the gate mask 150.

The first contact 165 may be formed by forming a conductive layer on the first insulating interlayer 160 to fill the first contact hole 163, and by planarizing an upper portion of the conductive layer until a top surface of the first insulting interlayer 160 is exposed. Therefore, the first contact 165 may directly contact the first extension portion 110*a* of the active pattern 110. In this case, a first contact area may be defined as an area where the first contact 165 and the active pattern 110 overlap. In example embodiments, the first contact 165 may include, e.g., doped polysilicon, a metal, or a metal nitride.

The first extension portion 110*a* of the active pattern 110 extends in the first direction, so a cross section of the first contact area may have a rectangular shape or an elliptical shape extending in the first direction. In other words, as illustrated in FIG. 5A, longitudinal directions of the first extension portion 110*a* and the first contact 165 extend in a same direction, so an overlap area between the first extension portion 110*a* and the first contact 165 may have a rectangular shape or an elliptical shape extending in the first direction. Therefore, the size of the first contact area, i.e., an overlap area between the first extension portion 110*a* and the first contact 165, may increase. In contrast, when an active pattern, e.g., an entire active pattern, extends in a direction oblique to the first direction, a cross section of an overlap area between the active area and a contact area may have a parallelogram shape, i.e., a size of the first contact area may be smaller than a comparable overlap area having a rectangular shape or an elliptical shape.

According to example embodiments, as a size of the first contact area is increased, e.g., as compared to a contact area between a contact and an entire active pattern extending in a direction oblique to the first direction, a contact resistance between the first contact 165 and the active pattern 110 may decrease. Further, the active pattern 110 may provide sufficient process margin for forming the first contact 165 to ensure reliability and to prevent misalignment between the first contact 165 and the active pattern 110.

Figure 6A:
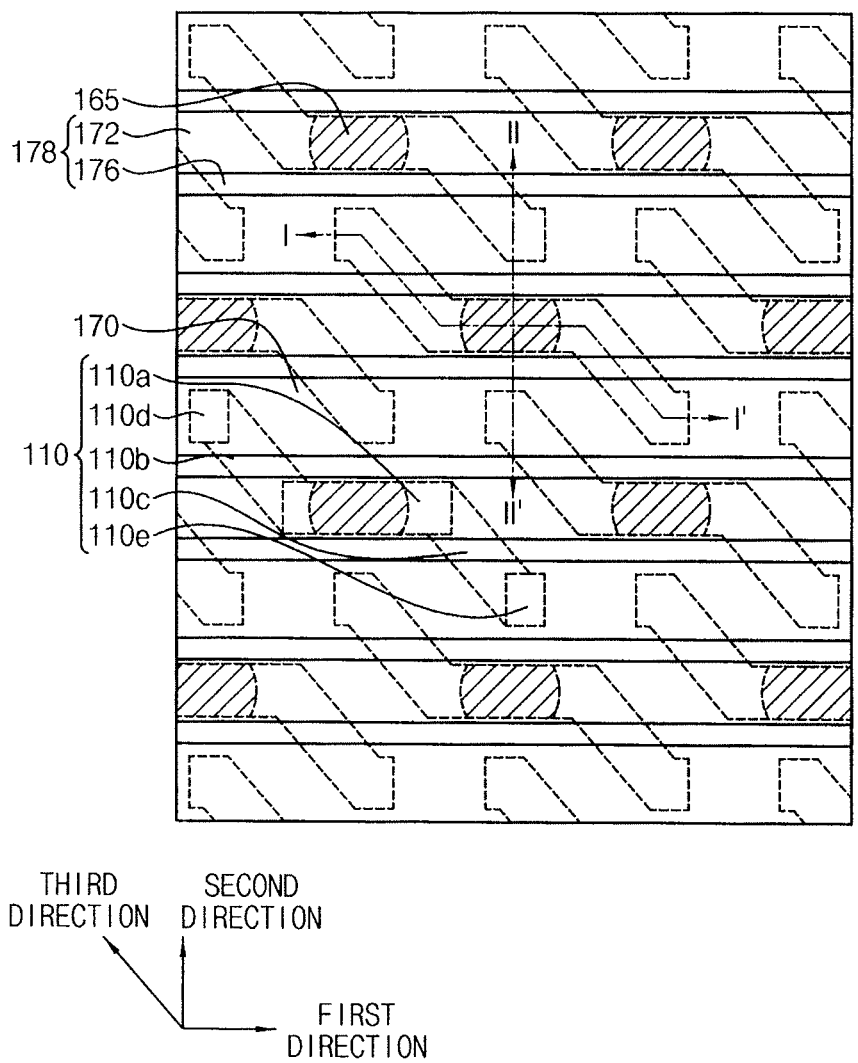
Figure 6B:
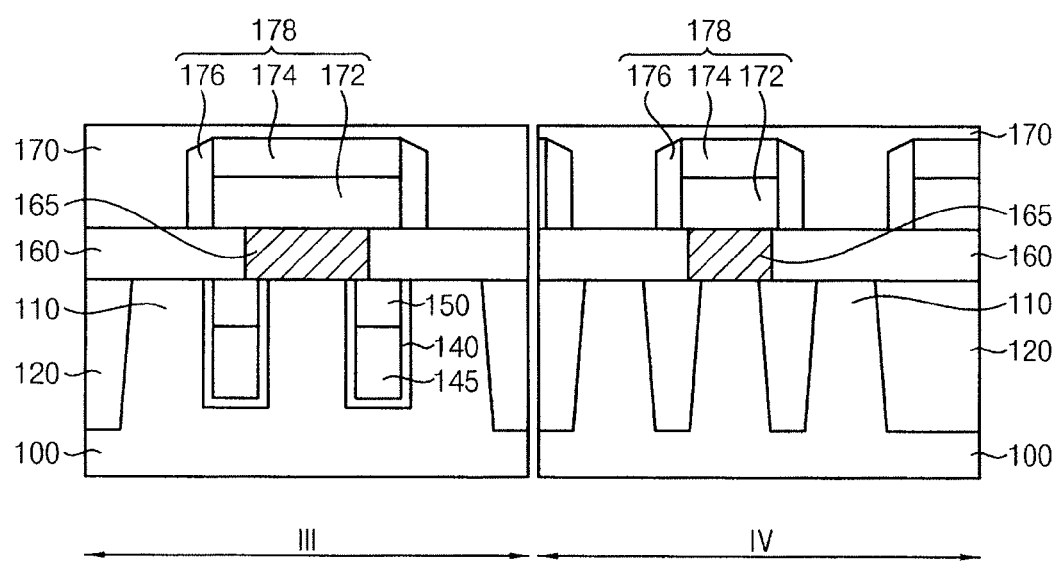

Referring to FIG. 6A and FIG. 6B, a bit line 172, a bit line mask 174, and a bit line spacer 176 may be formed on the first insulating interlayer 160 and the first contact 165.

The bit line 172 and the bit line mask 174 may be formed by forming a bit line layer and a bit line mask layer on the first insulating interlayer 160 and the first contact 165, and by patterning the bit line layer and the bit line mask layer. In example embodiments, a plurality of bit lines 172 and a plurality of bit line masks 174 may be arranged in the second direction. Each of the bit lines 172 and the bit line masks 174 may extend in the first direction, so that the bit lines 172 may be parallel to the first extension portion 110*a* of the active pattern 110. The bit line 172 may be disposed to overlap the first extension portion 110*a* of the active pattern 110. The bit line mask layer may be formed using silicon nitride or silicon oxy-nitride.

Then, the bit line spacer 176 may be formed on sidewalls of the bit line 172 and the bit line mask 174. The bit line spacer 176 may be formed by forming a spacer layer on the first insulating interlayer 160 and the first contact 165 to cover the bit line 172 and the bit line mask 174, and by anisotropically etching the spacer layer. Therefore, the bit line spacer 176 may extend in the first direction. For example, the bit line spacer 176 may include silicon nitride or silicon oxy-nitride. Therefore, a bit line structure 178 extending in the first direction may be formed to include the bit line 172, the bit line mask 174 and the bit line spacer 176.

Then, a second insulating interlayer 170 may be formed on the first insulating interlayer 160 and the first contact 165 to cover the bit line structure 178. In example embodiments, the second insulating interlayer 170 may include a material substantially the same as or similar to that of the first insulating interlayer 160.

Figure 7A:
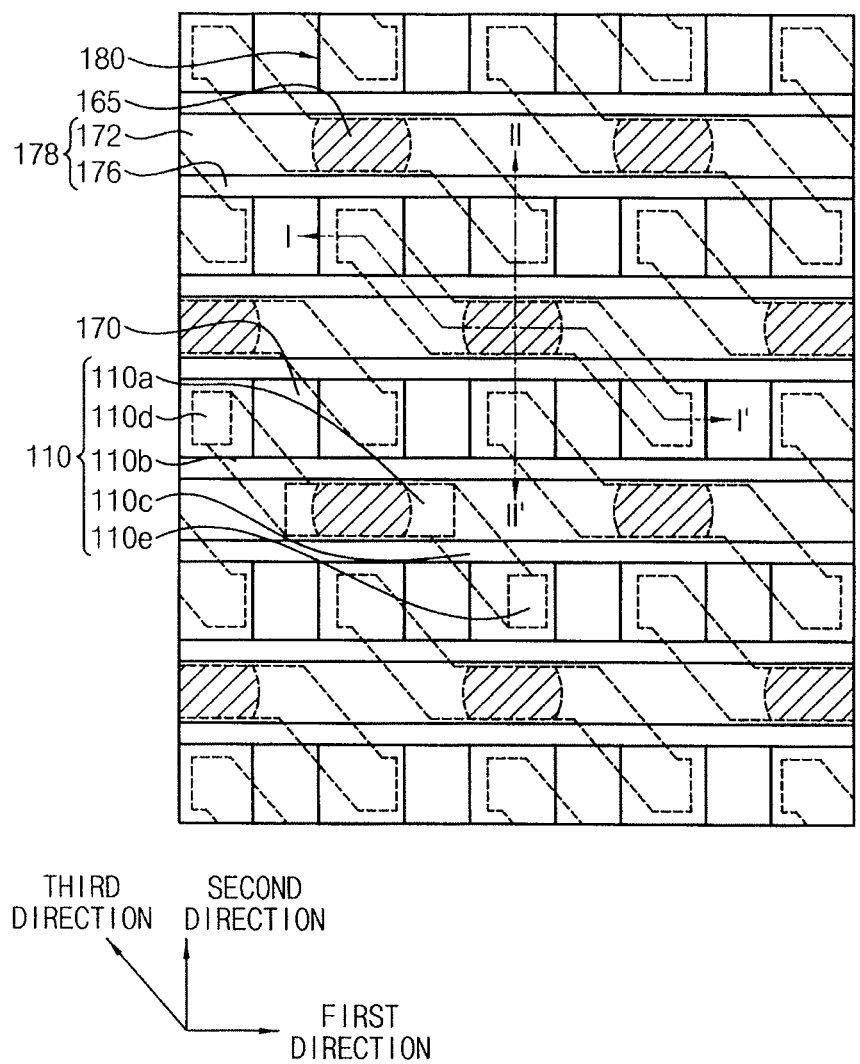
Figure 7B:
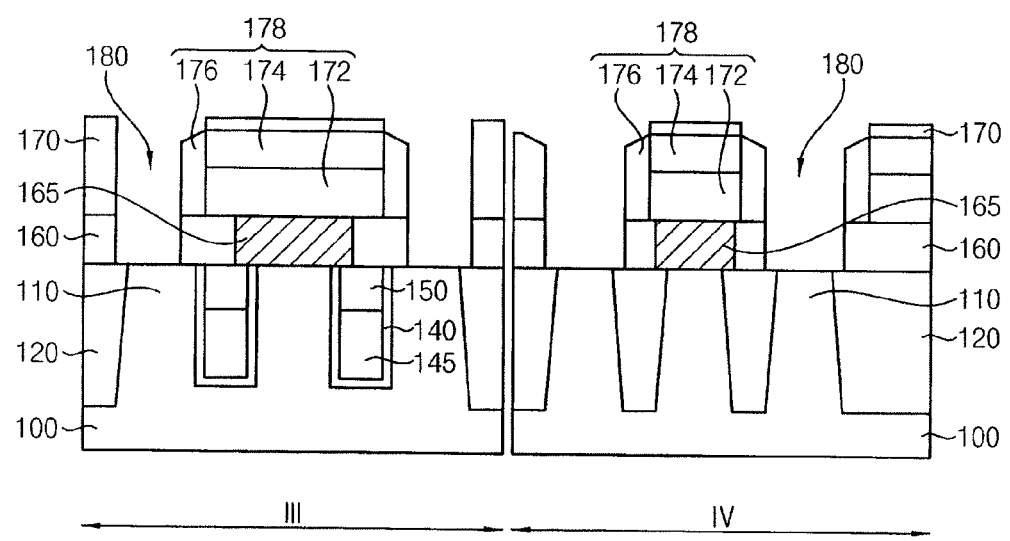

Referring to FIG. 7A and FIG. 7B, the first insulating interlayer 160 and the second insulating interlayer 170 may be partially removed to form a second contact hole 180 exposing the active pattern 110.

The second contact hole 180 may be formed by forming a mask on the second insulating interlayer 170 extending in the second direction, by removing the first insulating inter layer 160 and the second insulating interlayer 170 using the mask, the bit line spacer 176 and the bit line mask 174 as an etch mask. Therefore, the second contact hole 180 may be disposed not to overlap the mask, the bit line spacer 176 and the bit line mask 174. The mask may extend in the second direction, and the bit line mask 174 and the bit line spacer 176 may extend in the first direction, so that the second contact hole 180 may have a rectangular shape extending in the first direction. That is, the rectangular shape may have a long side in the first direction and a short side in the second direction.

The second contact hole 180 may sufficiently expose the first projection portion 110*d* and the second projection portion 110*e* of the active pattern 110, and may partially expose the second extension portion 110*b* and the third extension portion 110*c* of the active pattern 110. The first projection portion 110*d* and the second projection portion 110*e* may protrude in the first direction or a direction opposed to the first direction, and may have a rectangular shape or an elliptical shape extending in the first direction.

Figure 8A:
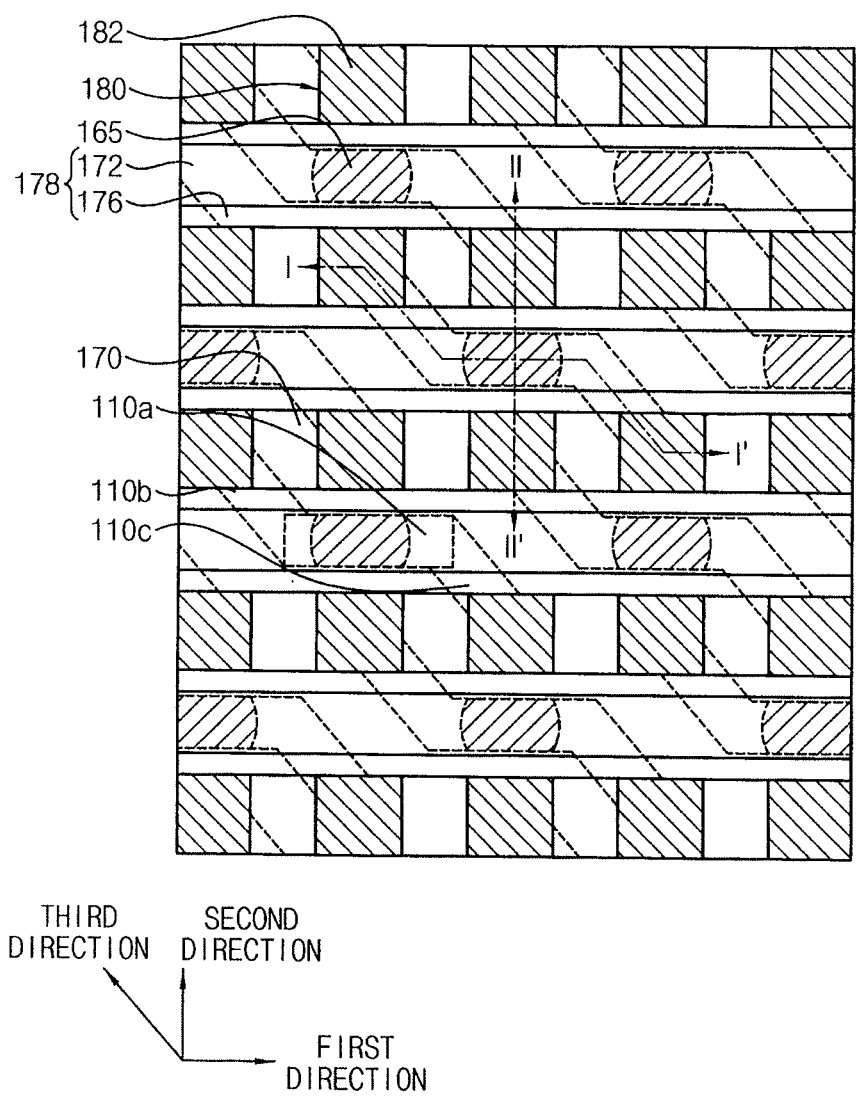
Figure 8B:
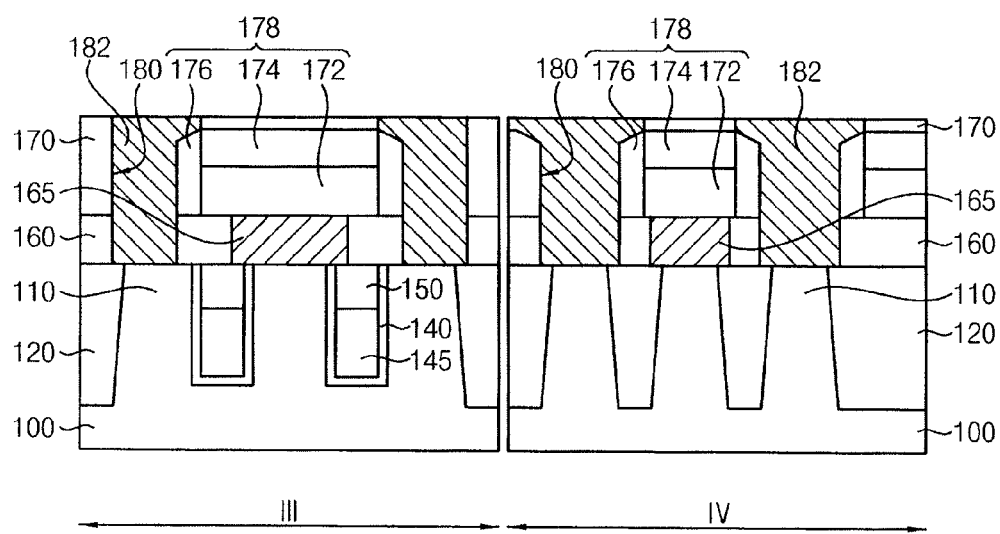

Referring to FIG. 8A and FIG. 8B, a second contact 182 may be formed to fill the second contact hole 180.

The second contact 182 may be formed by forming a conductive layer on the second insulating interlayer 170 to fill the first contact hole 180, and by planarizing an upper portion of the conductive layer until a top surface of the second insulating interlayer 170 is exposed. For example, the conductive layer may be formed using, e.g., a doped polysilicon, a metal, or a metal nitride. Therefore, the second contact 182 may directly contact the active pattern 110. More particularly, the second contact 182 may directly contact the first projection portion 110*d* or the second projection portion 110*e* of the active pattern 110. In this case, a second contact area may be defined as an area where the second contact 182 and the active pattern 110 overlap each other.

The second contact 182 may have a rectangular shape or an elliptical shape extending in the first direction. That is, the second contact 182 may be substantially parallel to the first projection portion 110*d* and the second projection portion 110*e*, so that a size of the second contact area, i.e., an overlap area between the second contact 182 and either one of the first and second projection portions 110*d* and 110*e*, may increase. In contrast, when projection portions extend in a direction oblique to the first direction, i.e., non-parallel with respect to a contact parallel to the first direction, a cross section of an overlap area between the contact and the projection portions may have an inclined shape, which has a smaller size than that of a cross section between two parallel elements.

Therefore, according to example embodiments, the size of the second contact area may be large, so that a contact resistance between the second contact 182 and the active pattern 110 may decrease. Further, the active pattern 110 may provide sufficient process margin for forming the second contact 182 to ensure reliability and to prevent misalignment between the second contact 182 and the active pattern 110.

Figure 9B:
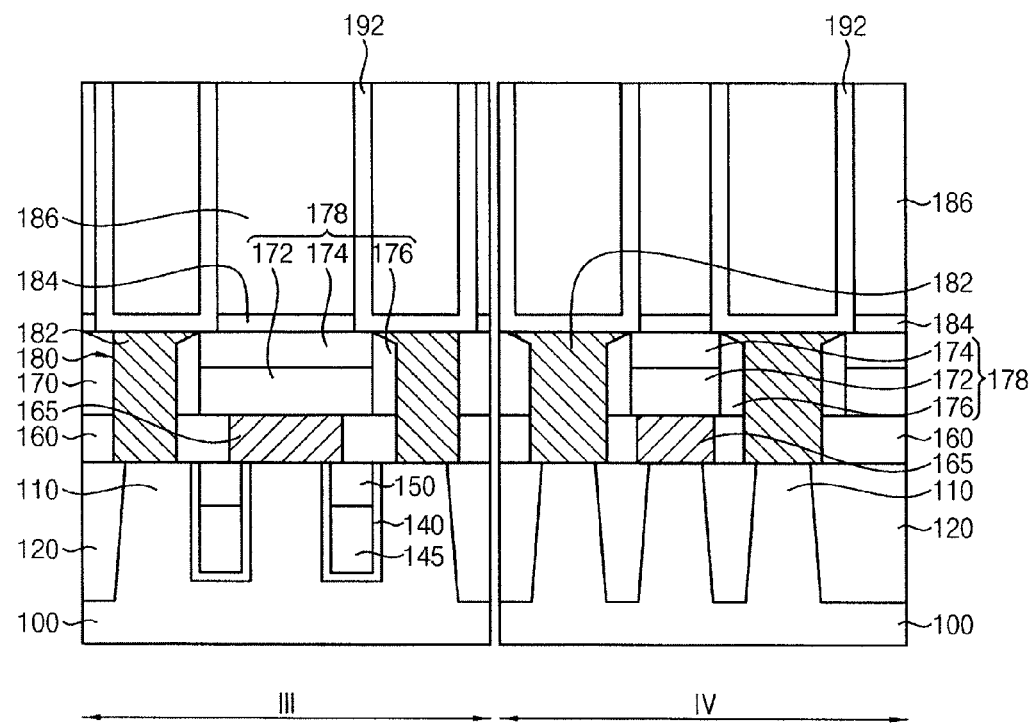

Referring to FIG. 9A and FIG. 9B, a lower electrode 192 may be formed on the second insulating interlayer 170 to contact the second contact 182.

In the process for forming the lower electrode 192, an etch stop layer 184 and a sacrificial layer 186 may be formed on the second insulating interlayer 170 and the second contact 182, and the etch stop layer 184 and the sacrificial layer 186 may be partially removed to form an opening 188. A lower electrode layer may be formed on an inner wall of the opening 188, and an upper portion of the lower electrode layer may be planarized.

In example embodiments, the sacrificial layer may be formed using, e.g., silicon oxide, and the lower electrode layer may be formed using, e.g., a metal or a metal nitride. That is, the lower electrode layer may be formed using a metal, e.g., copper, aluminum, tungsten, platinum, rubidium, iridium, etc., or a metal nitride, e.g., titanium nitride, tantalum nitride, tungsten nitride, etc. Then, the sacrificial layer 186 may be removed by an etching process.

Figure 10B:
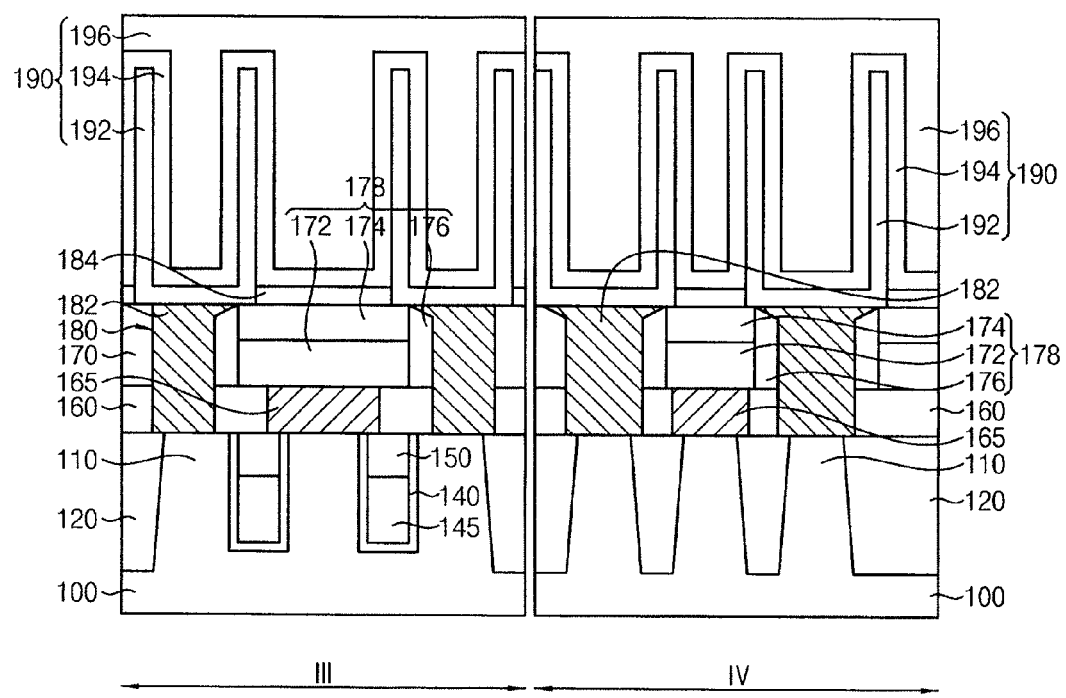

Referring to FIG. 10A and FIG. 10B, a dielectric layer 194 and an upper electrode 196 may be formed.

The dielectric layer 194 may be formed using a high dielectric material having a dielectric constant substantially higher than that of silicon oxide or silicon nitride. For example, the high dielectric material may include at least one of tantalum oxide, hafnium oxide, aluminum oxide, zirconium oxide, etc. The high dielectric material may be used alone, or may be used as a mixture thereof. The dielectric layer 194 may be formed by a CVD process, a PVD process, an ALD process, and the like.

Then, the upper electrode 196 may be formed using a metal, a metal nitride or doped polysilicon by a CVD process, a PVD process, an ALD process, and the like. The upper electrode 196 may be a cylinder type or may be a thin film type. Therefore, a capacitor 190 may be formed to include the lower electrode 192, the dielectric layer 194 and the upper electrode 196.

In example embodiments, a plurality of capacitors 190 may be arranged in the first direction and the second direction, however embodiments are not limited thereto. For example, the capacitors 190 may be arranged in a zigzagged pattern in the first direction.

By performing the above processes, the semiconductor device may be completed.

FIG. 11 illustrates a plan view of a semiconductor device including an active pattern in accordance with other example embodiments. The semiconductor device illustrated in FIG. 11 may be substantially the same as or similar to that illustrated with reference to FIG. 1 except for an active pattern 112. Thus, like reference numerals refer to like elements, and repetitive explanations thereof will be omitted.

Referring to FIG. 11, the semiconductor device may include the substrate 100 including an active pattern 112 and the isolation layer 120 surrounding the active pattern 112.

In example embodiments, a plurality of active patterns 112 may be arranged in a first direction substantially parallel to a top surface of the substrate 100 and a third direction oriented obliquely to the first direction. Each of the active patterns 112 may include a plurality of extension portions extending in different directions. In example embodiments, the active pattern 112 may include a first extension portion 112a, a second extension portion 112b, a third extension portion 112c, a first projection portion 112d, and a second projection portion 112e.

The first extension portion 112a may extend in the first direction. The first extension portion 112a may have a first width W1 in a second direction substantially perpendicular to the first direction. The second extension portion 112b may extend from a first end of the first extension portion 112a in the third direction, and third extension portion 112c may extend from a second end of the first extension portion 112a in a direction opposed to the third direction. In example embodiments, each of the second extension portion 112b and the third extension portion 112c may have a width substantially larger than the first width W1 of the first extension portion 112a. Further, the first projection portion 112d may protrude from the second extension portion 112b in a direction opposed to the first direction, and the second projection portion 112e may protrude from the third extension portion 112c in the first direction.

According to example embodiments, the active pattern 112 may include the first extension portion 112a, the first projection portion 112d, and the second projection portion 112e that extend or protrude in the first direction. The first extension portion 112a, the first projection portion 112d, and the second projection portion 112e may overlap contacts that are electrically connected to a capacitor (see FIG. 10B) or a bit line (see FIG. 10B). The contacts may have a rectangular shape or an elliptical shape extending in the first direction, so that the overlapped area between the contacts and the active pattern 112 may increase and the active pattern 112 may provide sufficient process margin to ensure reliability. Each of the second extension portion 112b and the third extension portion 112c may have a width substantially larger than the first width W1 of the first extension portion 112a. Therefore, a width of a channel region of a gate structure may increase, and an operation speed of the semiconductor device may increase.

FIGS. 12 to 17 illustrate plan views of stages in a method of manufacturing a semiconductor device in accordance with other example embodiments. Some aspects of the methods illustrated in FIGS. 12 to 17 are substantially the same as or similar to those illustrated with reference to FIGS. 2 to 10B. Thus, like reference numerals refer to like elements, and repetitive explanations thereof will be omitted.

Figure 12:
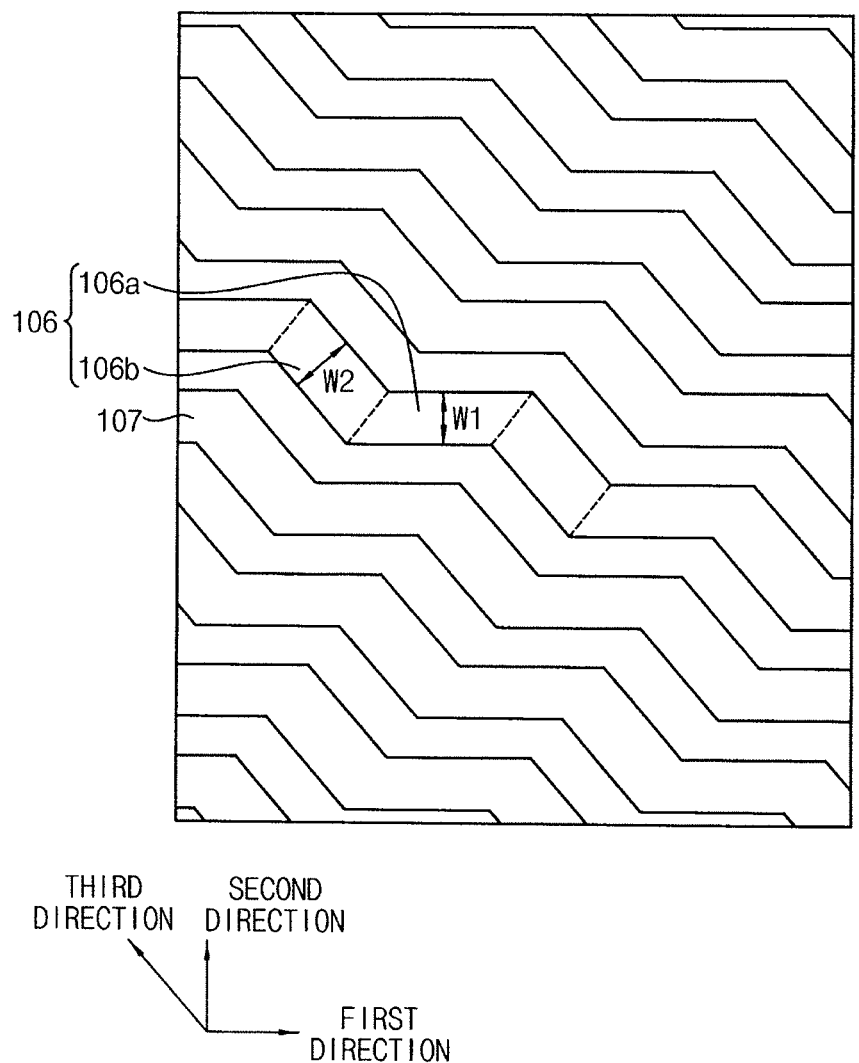

Referring to FIG. 12, an upper portion of the substrate 100 may be removed to form the first trench 107, thereby defining a preliminary active pattern 106.

The first trench 107 may be formed by forming a mask on the substrate 100, and removing the upper portion of the substrate 100 using the mask as an etching mask. In example embodiments, the first trench 107 may extend in a first direction, and may extend in a third direction oriented obliquely to the first direction. That is, each of the first trenches 107 may include a plurality of first portions extending in the first direction and a plurality of second portions extending in the third direction that may be arranged alternately and repeatedly.

Therefore, the preliminary pattern 106 may include first extension portion 106a extending in the first direction and the second extension portion 106b extending in the third direction. Further, the first extension portion 106a and the second extension portion 106b may be arranged alternately and repeatedly. In example embodiment, the first extension portion 106a may have the first width W1 in the second direction, and the second extension portion 106b may have a second width W2 substantially larger than that of the first extension portion 106a. As illustrated in FIG. 12, the second width W2 is measured along an oblique direction with respect to the second direction, e.g., a direction perpendicular to the third direction.

Figure 13:
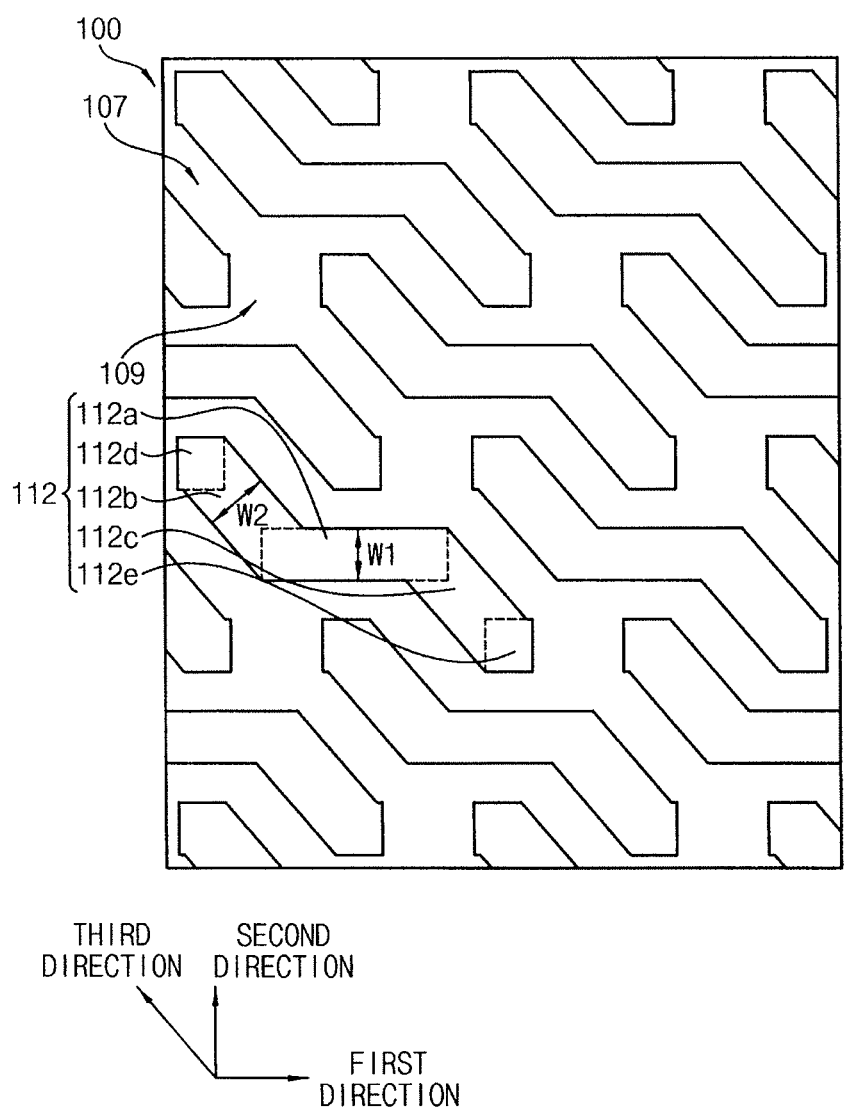

Referring to FIG. 13, an upper portion of the substrate 100 may be removed to from the second trench 109, thereby defining the active pattern 112. Then, the isolation layer 120 may be formed to fill the first trench 107 and the second trench 109.

The second trench 109 may be formed by forming a mask on the substrate 100, and removing the upper portion of the substrate 100 using the mask as an etching mask. In example embodiments, the second trench 109 may be disposed to partially overlap the first extension portion 106a of the preliminary active pattern 106. The second trench 109 may be in fluid communication with the first trench 107. Therefore, the active pattern 112 may be defined by the first trench 107 and the second trench 109.

In example embodiments, the active pattern 112 may include the first extension portion 112a, the second extension portion 112b, the third extension portion 112c, the first projection portion 112d, and the second projection portion 112e. The active pattern 112 may be substantially the same as the active pattern 112 described with reference to FIG. 11

Then, an insulation layer may be formed on the substrate 100 to fill the first trench 107 and the second trench 109. Then, an upper portion of the insulation layer may be planarized until the top surface of the substrate 100 is exposed, thereby forming the isolation layer 120.

Figure 14:
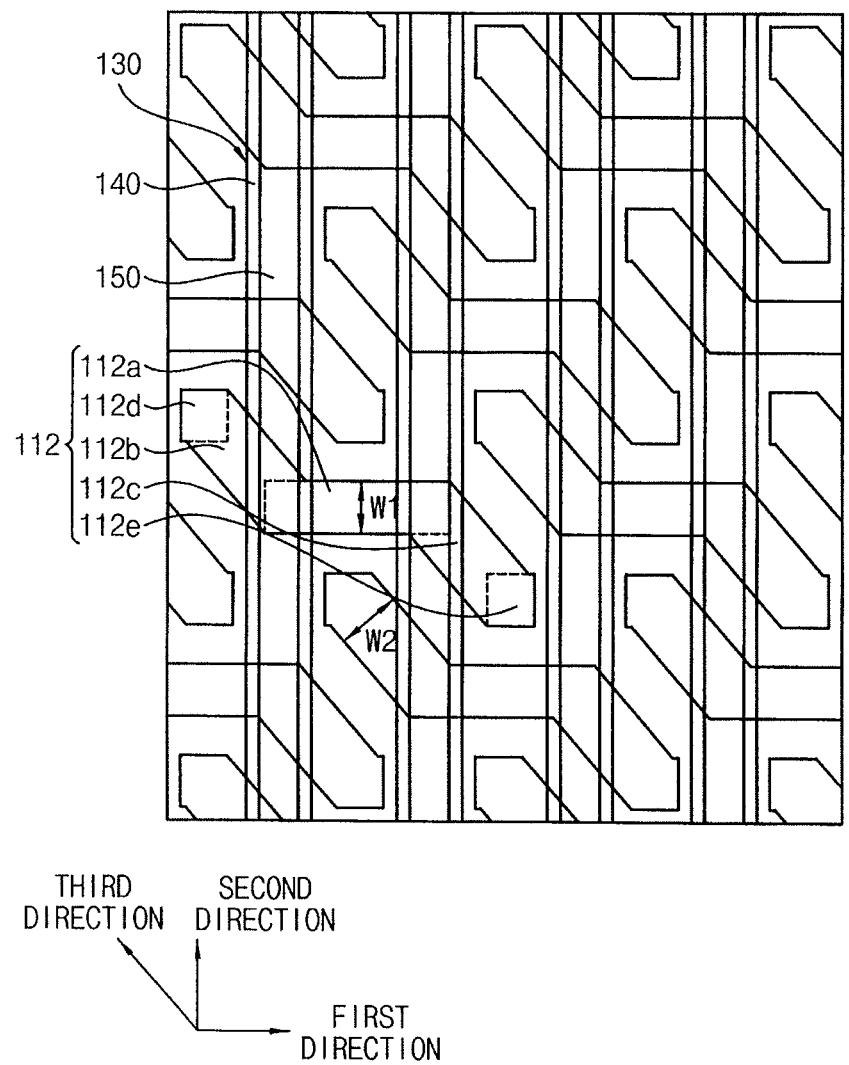

Referring to FIG. 14, upper portions of the substrate 100 and the isolation layer 120 may be removed to form the third trench 130. Then, the gate insulation layer pattern 140, the gate electrode 145, and the gate mask 150 may be formed to fill the third trench 130.

The third trench 130 may extend in the second direction. In example embodiments, a plurality of third trenches 130 may be arranged in the first direction. More particularly, the third trench 130 overlaps an interface between the first extension portion 112a and the second extension portion 112b or an interface between the first extension portion 112a and the third extension portion 112c. The second extension portion 112b and the third extension portion 112c may have the second width W2, and a channel region, where the gate electrode 145 and the active pattern 112 are overlapped, may have the second width W2. Therefore, a current passing through the channel region may increase, and the operation speed of the semiconductor device may increase.

Referring to FIG. 15, the first insulating interlayer 160 may be formed on the substrate 100, the isolation layer 120, the gate mask 150, and the gate insulation layer pattern 140, and the first contact 165 may be formed through the first insulating interlayer 160. Then, the bit line 172 may be formed to contact the first contact 165.

The first contact 165 may directly contact the first extension portion 112a of the active pattern 112. In this case, a first contact area may be defined as an area where the first contact 165 and the active pattern 112 are overlapped.

The first extension portion 112a of the active pattern 112 may extend in the first direction, and a cross section of the first contact area may have a rectangular shape or an elliptical shape extending in the first direction. Therefore, the size of the first contact area may be large, so that a contact resistance between the first contact 165 and the active pattern 112 may decrease. Further, the active pattern 112 may provide sufficient process margin for forming the first contact 165 to ensure reliability and to prevent misalignment between the first contact 165 and the active pattern 112.

Figure 16:
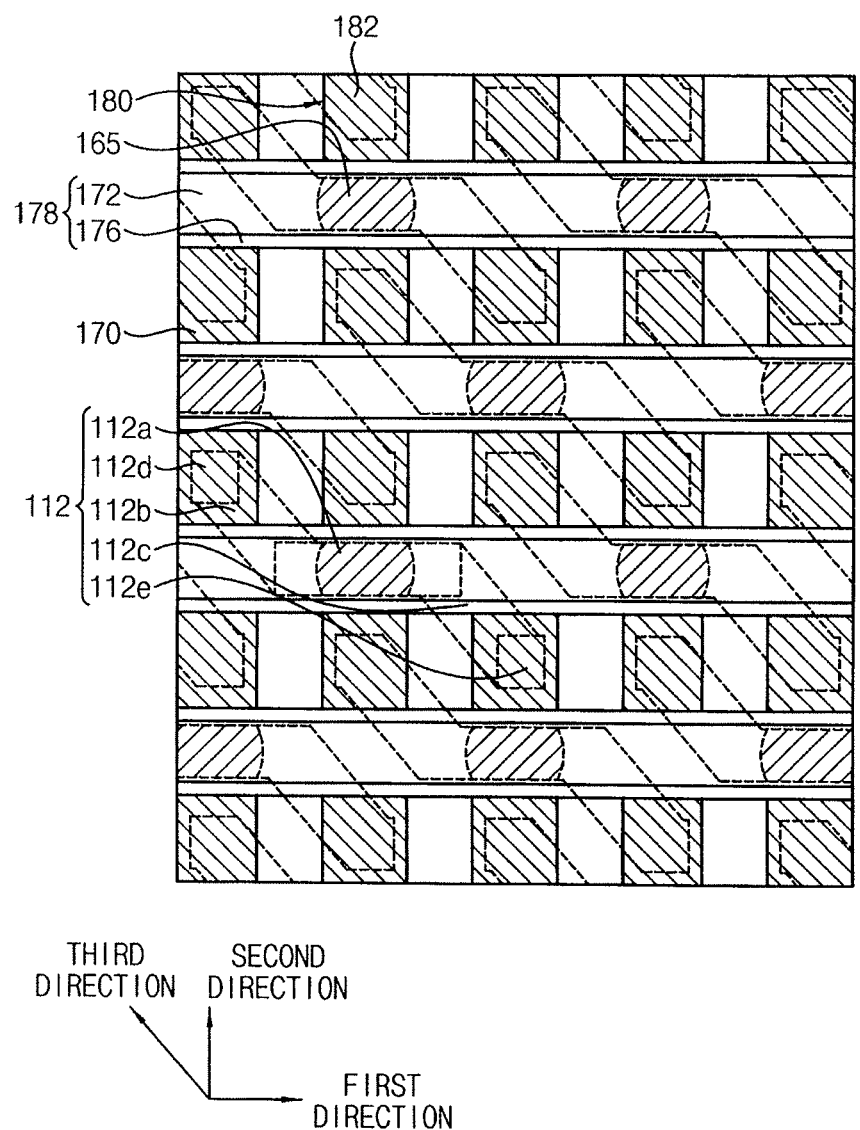

Referring to FIG. 16, the first insulating inter layer 160 and the second insulating interlayer 170 may be partially removed to form the second contact hole 180. The second contact 182 may be formed to fill the second contact hole 180.

The second contact hole 180 may sufficiently expose the first projection portion 112d and the second projection portion 112e of the active pattern 112. The first projection portion 112d and the second projection portion 112e may protrude in the first direction or a direction opposed to the first direction, and may have a rectangular shape or an elliptical shape extending in the first direction.

The second contact 182 may contact the active pattern 112. More particularly, the second contact 182 may directly contact the first projection portion 112d or the second projection portion 112e of the active pattern 112. In this case, the second contact area may be defined as an area where the second contact 182 and the active pattern 112 are overlapped.

The second contact 182 may have a rectangular shape or an elliptical shape extending in the first direction. That is, the second contact 182 may be substantially parallel to the first projection portion 112d and the second projection portion 112e, so that the size of the second contact area may increase, and a contact resistance between the second contact 182 and the active pattern 112 may decrease. Further, the active pattern 112 may provide sufficient process margin for forming the second contact 182 to ensure reliability and to prevent misalignment between the second contact 182 and the active pattern 112.

Figure 17:
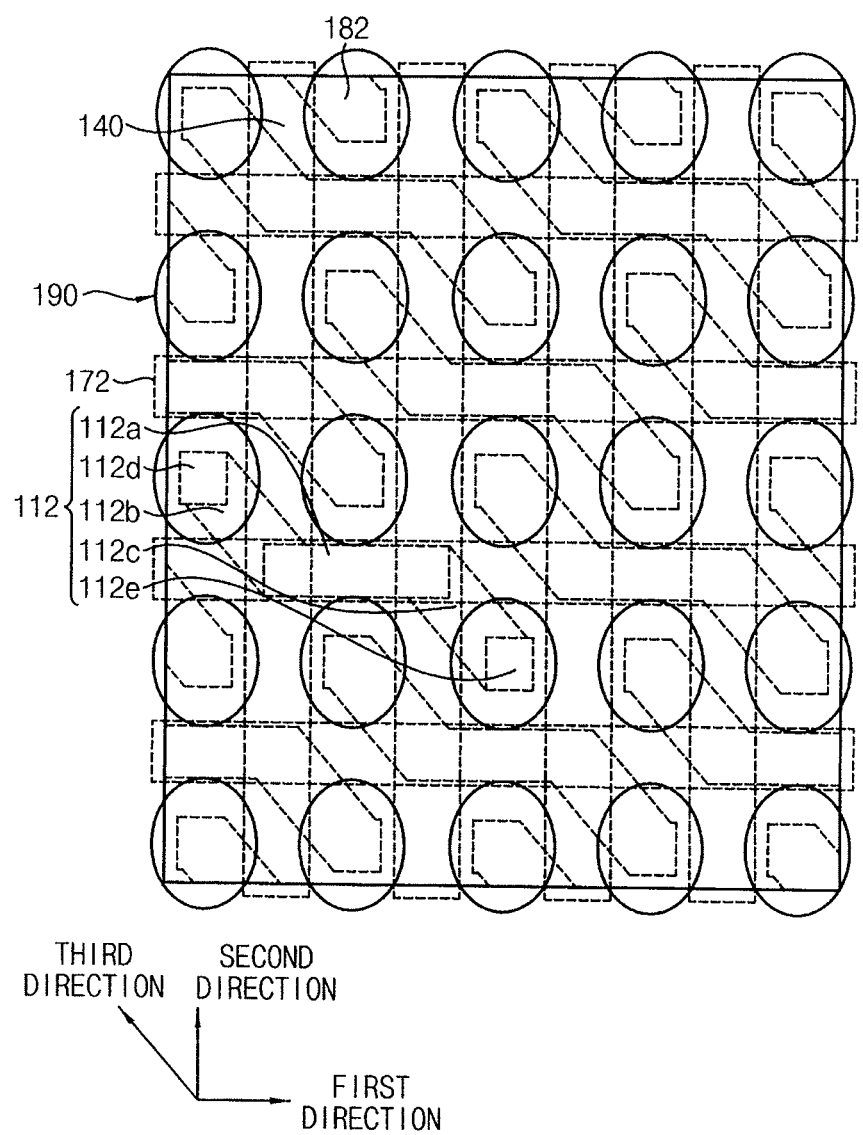

Referring to FIG. 17, the capacitor 190 may be formed to be electrically connected to the second contact 182. The processes for forming the capacitor may be substantially the same as those described with reference to FIGS. 9 and 10B.

By performing above processes, the semiconductor device may be completed.

Figure 18:
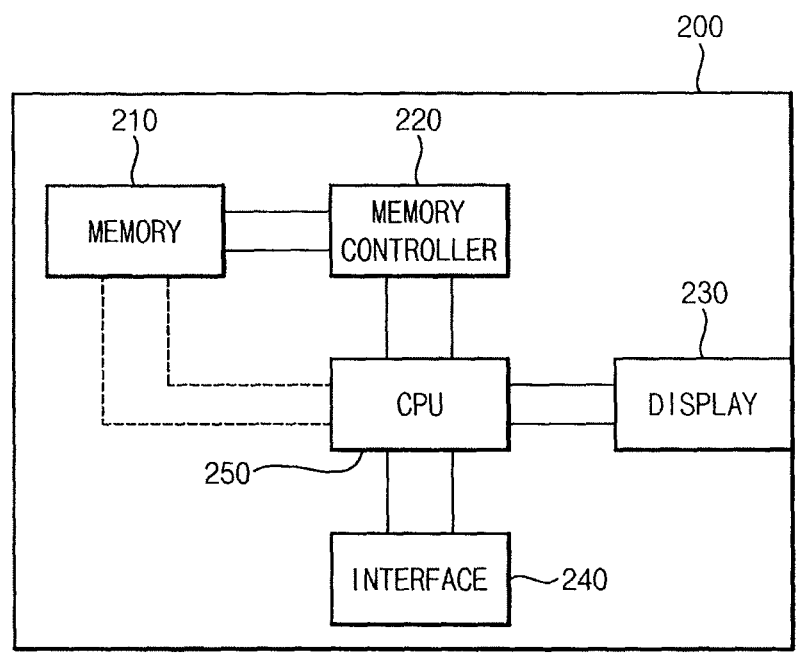

FIG. 18 illustrates a block diagram for explaining a system including a semiconductor device in accordance with example embodiments.

Referring to FIG. 18, a system 200 may include a memory 210, a memory controller 220 controlling the operation of the memory 210, a displaying part 230 outputting information, an interface 240 receiving information, and a main processor 250 controlling the above described parts. The memory 210 may be a semiconductor device in accordance with example embodiments. The memory 210 may be directly connected to the main processor 250 or through a bus. The system 200 may be applied to, e.g., a computer, a portable computer, a laptop computer, a personal portable terminal, a tablet, a cellular phone, a digital music player, etc.

According to some example embodiments, an active pattern may include multiple portions that extend in different directions. That is, the active pattern may include a first extension portion, a first projection portion, and a second projection portion parallel to each other, while portions connecting the first extension portion to each of the first and second projection portions extend obliquely with respect to the first extension portion. The first extension portion, the first projection portion, and the second projection portion may directly contact conductive contacts electrically connected to a capacitor and/or a bit line, so that an overlapped area between the conductive contacts and the active pattern is increased. Therefore, a contact resistance between the conductive contacts and the active pattern may decrease, and the active pattern may provide sufficient process margin to ensure reliability.

In contrast, as an entire active pattern of a conventional semiconductor, e.g., a DRAM, may extend diagonally and be electrically connected to a bit line by a first contact and to a capacitor by a second contact, and as a size of the active patterns is decreased, a contact area between the active pattern and the contacts may decrease. As such, a contact resistance between the active pattern and the contacts may increase, thereby reducing the operation speed of the semiconductor device due to RC delay.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate including an active pattern surrounded by an isolation layer, the isolation layer being disposed at an upper portion of the substrate,
    wherein the active pattern includes:
        a first extension portion extending in a first direction substantially parallel to a top surface of the substrate,
        a second extension portion extending from a first end of the first extension portion in a third direction oriented obliquely to the first direction,
        a third extension portion extending from a second end of the first extension portion in a direction opposed to the third direction,
        a first projection portion protruding from the second extension portion in a direction opposed to the first direction, the first projection portion being spaced apart from the first extension portion, and
        a second projection portion protruding from the third extension portion in the first direction, the second projection portion being spaced apart from the first extension portion;
    a bit line extending in the first direction above the substrate; and
    a contact connecting the bit line with the first extension portion of the active pattern, wherein the contact comprises a first width, in a second direction perpendicular to the first direction, that is wider than a second width of the first extension portion of the active pattern in the second direction.

2. The semiconductor device as claimed in claim 1, wherein:
    the first projection portion and the second projection portion are 180 degree rotationally symmetric about an axis passing through a center of the first extension portion in a fourth direction perpendicular to the first direction and the third direction, and
    the second extension portion and the third extension portion are 180 degree rotationally symmetric about the axis.

3. The semiconductor device as claimed in claim 1, wherein lengths of the first projection portion and the second projection portion in the first direction are smaller than a length of the first extension portion in the first direction.

4. The semiconductor device as claimed in claim 1, wherein a width of the first extension portion is the same as widths of the second extension portion and the third extension portion.

5. The semiconductor device as claimed in claim 1, wherein a width of the first extension portion is smaller than widths of the second extension portion and the third extension portion.

6. The semiconductor device as claimed in claim 1, wherein the contact comprises a first contact, and wherein the device further comprises:
    a capacitor above the substrate; and
    a second contact connecting the capacitor with the first projection portion or the second projection portion of the active pattern.

7. The semiconductor device as claimed in claim 6, wherein a cross section of a region, where the first contact and the active pattern overlap, has a rectangular shape or an elliptical shape extending in the first direction.

8. The semiconductor device as claimed in claim 6, wherein a cross section of the second contact has a rectangular shape extending in the first direction.

9. The semiconductor device as claimed in claim 1, wherein a plurality of active patterns is arranged in the first direction and the third direction.

10. A method of manufacturing a semiconductor device, the method comprising:
    forming a trench by removing an upper portion of a substrate, thereby defining an active pattern of the substrate; and
    forming an isolation layer to fill the trench,
    wherein the active pattern includes:
        a first extension portion extending in a first direction substantially parallel to a top surface of the substrate,
        a second extension portion extending from a first end of the first extension portion in a third direction, the third direction being oriented obliquely to the first direction,
        a third extension portion extending from a second end of the first extension portion in a direction opposed to the third direction,
        a first projection portion protruding from a first end of the second extension portion in a direction opposed to the first direction, the first end of the second extension portion being spaced apart from the first end of the first extension portion, and
        a second projection portion protruding from a first end of the third extension portion in the first direction, the first end of the third extension portion being spaced apart from the second end of the first extension portion;
    forming a contact directly contacting the first extension portion of the active pattern; and
    forming a bit line extending in the first direction, the bit line being electrically connected to the contact, wherein the contact comprises a first width, in a second direction perpendicular to the first direction, that is wider than a second width of the first extension portion of the active pattern in the second direction.

11. The method as claimed in claim 10, wherein forming the trench includes:
    forming a first trench extending in the first direction and the third direction alternately and repeatedly, thereby defining a preliminary active pattern; and
    forming a second trench extending in the second direction, the second trench being in fluid communication with the first trench.

12. The method as claimed in claim 10, wherein the contact comprises a first contact, and wherein the method further comprises:
- forming a second contact directly contacting the first projection portion or the second projection portion of the active pattern; and
- forming a capacitor electrically connected to the second contact.

13. The method as claimed in claim 12, further comprising forming a bit line spacer on a side wall of the bit line after forming the bit line.

14. The method as claimed in claim 13, wherein forming the second contact comprises:
- forming an insulating interlayer above the substrate to cover the bit line;
- forming a contact hole exposing the first projection portion or the second projection portion of the active pattern by removing the insulating interlayer; and
- forming a conductive pattern to fill the contact hole, and wherein the contact hole is disposed not to overlap the bit line or the bit line spacer, the contact hole having a rectangular shape extending in the first direction.

15. A semiconductor device comprising:
a substrate comprising an active pattern defined by an isolation layer in the substrate,
wherein the active pattern comprises:
- a first extension portion extending in a first direction that is perpendicular to a second direction,
- a first projection portion parallel to and spaced apart from the first extension portion,
- a second projection portion parallel to and spaced apart from the first extension portion,
- a second extension portion connecting the first extension portion and the first projection portion, the second extension portion extending in a third direction oriented obliquely to the first direction, and
- a third extension portion connecting the first extension portion and the second projection portion, the second and third extension portions being parallel to each other;
a bit line extending in the first direction over the substrate; and
a contact connecting the bit line with the first extension portion of the active pattern,
wherein the contact comprises a first width in the second direction that is wider than a second width of the first extension portion of the active pattern in the second direction.

16. The semiconductor device of claim 15, wherein the contact comprises a length in the first direction that is longer than the first width of the contact in the second direction.

17. The semiconductor device of claim 15, wherein:
the active pattern comprises a first active pattern;
the contact comprises a first contact;
the semiconductor device further comprises adjacent second and third active patterns comprising respective first extension portions, first projection portions, second projection portions, second extension portions, and third extension portions;
the semiconductor device further comprises second and third contacts on the respective first extension portions of the second and third active patterns;
the first through third contacts of the first through third active patterns comprise different respective positions in the first direction, when viewed in a plan view, and different respective positions in the second direction, when viewed in the plan view; and
the first through third active patterns at least partially overlap each other in the second direction when viewed in the plan view.

18. The semiconductor device as claimed in claim 15, wherein the contact comprises a first contact, and wherein the device further comprises:
- a capacitor above the substrate; and
- a second contact connecting the capacitor with the first projection portion or the second projection portion of the active pattern.

19. The semiconductor device as claimed in claim 18, wherein longitudinal directions of the first contact and the first extension portion are parallel, and
wherein an overlap region between the first contact and the first extension portion is rectangular or elliptical, a major axis of the rectangular region or the elliptical region extending in the first direction.

20. The semiconductor device as claimed in claim 18, wherein longitudinal directions of the first contact, second contact, and the first extension portion are parallel.

* * * * *